US006242273B1

(12) United States Patent
Goodwin et al.

(10) Patent No.: US 6,242,273 B1
(45) Date of Patent: Jun. 5, 2001

(54) FRACTAL FILTER APPLIED TO A CONTAMINATION-FREE MANUFACTURING SIGNAL TO IMPROVE SIGNAL-TO-NOISE RATIOS

(75) Inventors: Thomas J. Goodwin; Iraj Emami, both of Austin, TX (US); Charles E. May, Gresham, OR (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/408,232

(22) Filed: Sep. 29, 1999

(51) Int. Cl.[7] .............................. H01L 21/66; G01R 31/26
(52) U.S. Cl. ............................ 438/14; 382/225; 382/145; 364/468
(58) Field of Search .............................. 438/14; 382/145, 382/225; 250/214; 364/468

(56) References Cited

U.S. PATENT DOCUMENTS 5,420,796 * 5/1995 Weling et al. .................... 364/468
5,949,064 * 9/1999 Chow et al. ...................... 250/214
6,091,846 * 7/2000 Lin et al. .......................... 382/145
6,108,446 * 8/2000 Hoshen ............................. 382/225

OTHER PUBLICATIONS

Bunde et al., "Fractals and Disordered Systems," *2 Percolation I*, title page, copyright page, pp. 97–117 (1996) and *3 Percolation II* (selected portions).

* cited by examiner

*Primary Examiner*—John F. Niebling
*Assistant Examiner*—Olivia Luk
(74) *Attorney, Agent, or Firm*—Williams, Morgan & Amerson

(57) ABSTRACT

A method is provided for manufacturing, the method including processing a workpiece in a processing step and detecting defect data after the processing of the workpiece in the processing step has begun. The method also includes filtering the defect data using a fractal filter and forming an output signal corresponding to at least one type of defect based on the fractally filtered defect data. The method further includes feeding back a control signal based on the output signal to adjust the processing performed in the processing step to reduce the at least one type of defect.

20 Claims, 25 Drawing Sheets

FRACTAL FILTER APPLIED TO A CONTAMINATION-FREE MANUFACTURING SIGNAL TO IMPROVE SIGNAL-TO-NOISE RATIOS

BACKGROUND OF THE INVENTION

1. Field of the Invention

This invention relates generally to semiconductor fabrication technology, and, more particularly, to a method for manufacturing a workpiece.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote. i.e. local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Many of the processing tools that are currently commercially available also suffer other deficiencies. In particular, even such tools as contamination-free manufacturing defect scanning tools may create false signals due to metal grains at interfaces between metal and oxide, for example. in the fabrication of certain types of semiconductor devices such as transistors. Such scanning tools may also not be able to detect particles and/or particulates on a wafer that has surface granularity, and/or on a wafer containing surface topography. In addition, for particles and/or particulates near the minimum-size detection limit. such scanning tools may not be able to detect those particles and/or particulates that are present on the wafer, and yet may detect non-existent particles and/or particulates that are not present of the wafer, producing false counts.

The present invention is directed to overcoming, or at least reducing the effects of, one or more of the problems set forth above.

SUMMARY OF THE INVENTION

In one aspect of the present invention, a method is provided for manufacturing, the method including processing a workpiece in a processing step and detecting defect data after he processing of the workpiece in the processing step has begun. The method also includes filtering the defect data using a fractal filter and forming an output signal corresponding to at east one type of defect based on the fractally filtered defect data. The method further includes feeding back a control signal based on the output signal to adjust the processing performed in the processing step to reduce the at least one type of defect.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
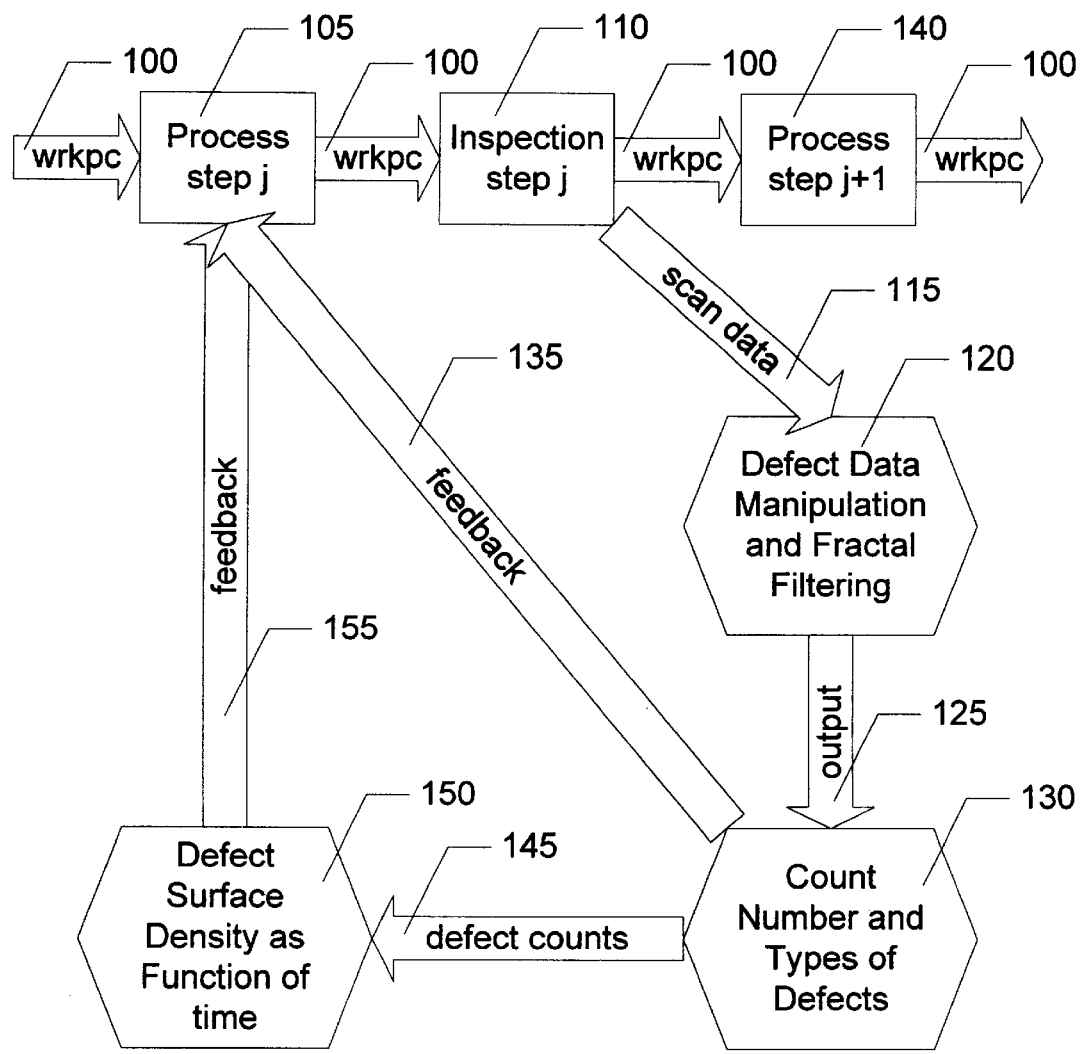
FIGS. 1–25 illustrate schematically various embodiments of a method for manufacturing according to the present invention.

While the invention is susceptible to various modifications and alternative forms. specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–28. As shown in FIG. 1, a workpiece 100, such as a semiconducting substrate or wafer, for example, is delivered to a processing step j 105, where j may have any value from j=1 to j=N. The total number N of processing steps, such as masking, etching, depositing material and the like, used to form the finished workpiece 100, may range from N=1 to about any finite value.

As shown in FIG. 1, the workpiece 100 is sent from the processing step j 105 to an inspection step j 110. In the inspection step j 110, the workpiece 100 is inspected to detect data indicative of defective processing in the processing step j 105. For example, in the inspection step j 110, the workpiece 100 may be scanned by an inspection tool capable of detecting metal bridges formed between features formed on the workpiece 100, producing scan data 115 indicative of defective processing. Additionally, and/or alternatively, in the inspection step j 110, the workpiece 100 may be scanned by an inspection tool capable of detecting microscratches, ragged polysilicon (poly) lines, blue dots (e.g., small circular defects detected optically, having a blue tint), extra patterns, and the like, formed on the workpiece 100, again producing scan data 115 indicative of defective processing.

As shown in FIG. 1, the scan data 115 is sent from the inspection step j 110 and delivered to a defect data manipulation and fractal filtering step 120. In the defect data manipulation and fractal filtering step 120, the scan data 115 may be manipulated, for example, by being classified according to the type of defect detected, producing the output signal 125.

Figure 2:
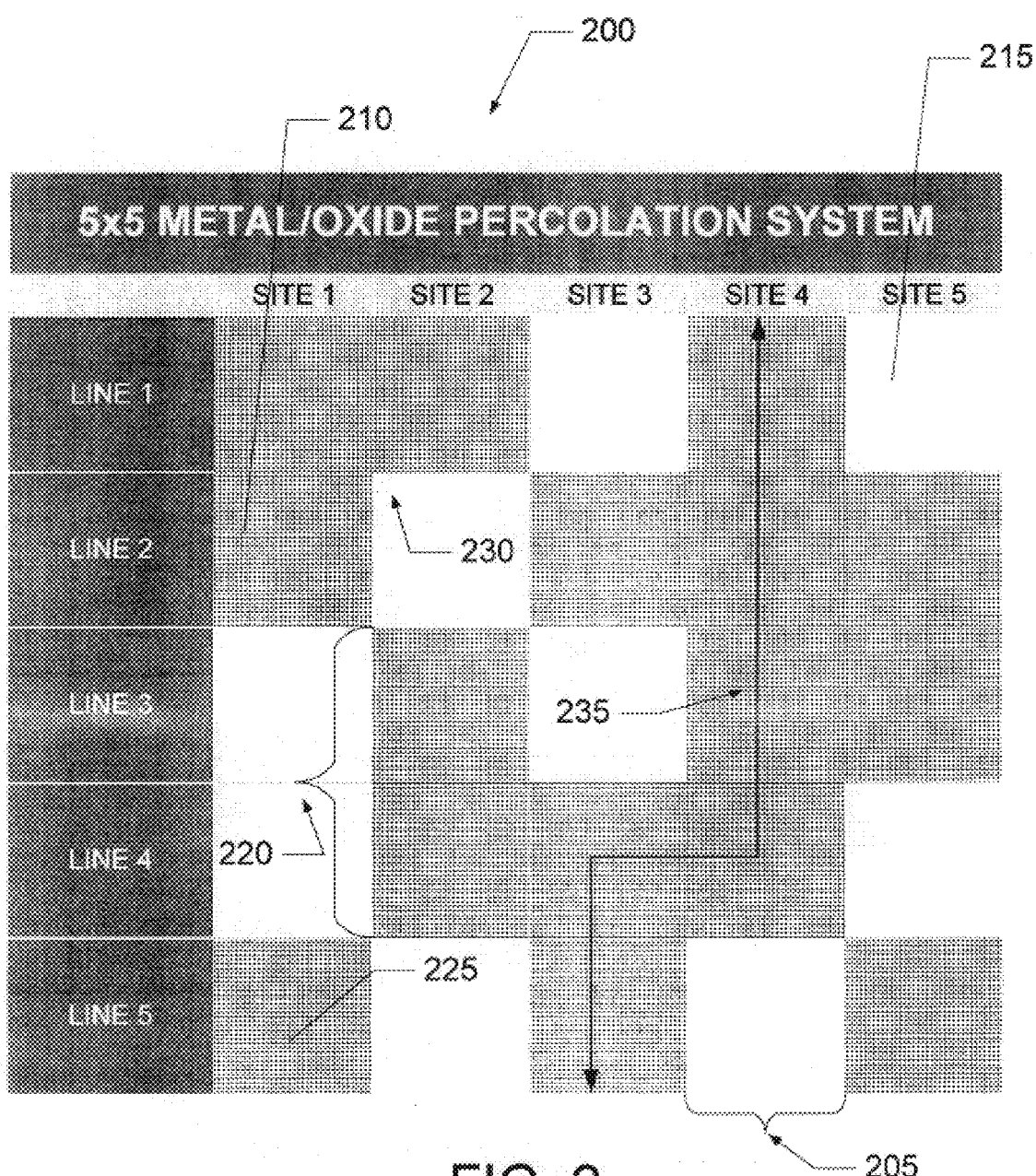
Figure 10:
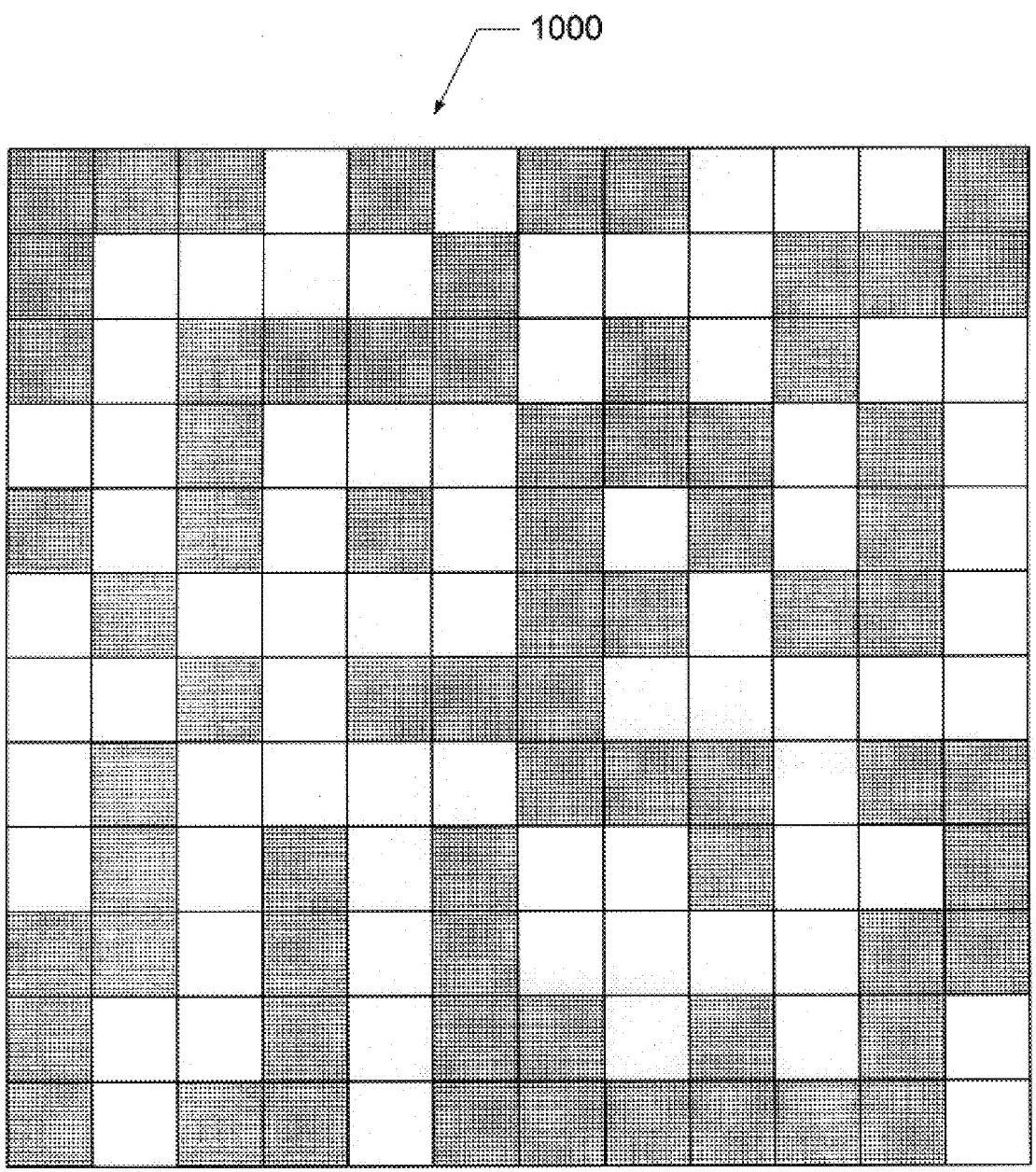

In illustrative embodiments, the scan data 115 may be manipulated to provide comparative and/or difference scan data, comparing one die to another on the same workpiece 100, for example. Noise due to nuisance problems such as metal grains and/or particles and/or particulates may be reduced by using a fractal-type filtering algorithm (fractal filtering) to filter the scan data 115 in the defect data manipulation and fractal filtering step 120. As shown in FIGS. 2 and 10, for example, the scan data 115, when presented in two-dimensional pixel (site) arrays 200 and 1000, respectively, may resemble a percolation system. This resemblance may be found when the scan data 115 represents a plan view, looking down on the workpiece 100 surface, as well as when the scan data 115 represents a cross-sectional view through the workpiece 100.

A percolation system represents a simple model of a disordered system. Consider a square lattice, the two-dimensional pixel (site) array 200, for example, as shown in FIG. 2, where each pixel (site) 205 is occupied randomly with probability p or is empty with probability q=1–p. Occupied and empty pixels (sites) 205 may represent very different physical properties. For example, occupied sites 210 may represent the presence of a conductor or a conductive material, such as a metal, whereas empty sites 215 may represent the presence of an insulator or a dielectric material, such as an oxide. Electrical current may then flow only between nearest-neighbor metal sites 220.

At lower concentrations (lower p values), the metal sites may either be isolated 225 or form small clusters of nearest-neighbor sites 230, and, in either case, resemble metal grains at a metal-oxide interface, for example. Two metal sites belong to the same cluster if they are connected by a path of nearest-neighbor sites 220 so that a current may flow between them. At lower concentrations (lower p values), the percolation system may behave like an insulator, since no conducting path connects opposite edges of the two-dimensional pixel (site) array 200, for example. At higher concentrations (higher p values), many conductive paths between opposite edges may exist (such as path 235 shown in FIG. 2), electrical currents may flow, and the percolation system may behave like a conductor.

At some intermediate concentration or p value, a threshold concentration ($p_c$) must exist where for the first time electrical current can percolate from one edge to the other. Below $p_c$, the percolation system may be an insulator, while above $p_c$, the percolation system may be a conductor. The threshold concentrations $p_c$ is called the percolation threshold, or., since it separates two different phases. the critical concentration.

In one illustrative embodiment, the Hoshen-Kopelman method of fractal filtering, described, for example, in *Fractals and Disordered Systems*, edited by Armin Bunde and Shlomo Havlin (Springer-Verlag, Berlin, Heidelberg, New York, 1996), pp. 97–98, may be applied to the scan data 115, for example, enabling a classification of pixels (sites) in the scan data 115 that places all pixels (sites) 205 with the same label in the same cluster and all pixels (sites) 205 with different labels in different clusters. The fractally filtered scan data 115 may thus get sorted by clusters and a pattern may emerge. The fractally filtered scan data 115 may then be presented in a user-friendly graphical representation that may be analyzed by an engineer to determine the patterns. The fractally filtered scan data 115 may additionally and/or alternatively be stored and used for comparison purposes in an artificial intelligence (AI)-based system and/or a knowledge-based system. Once the root causes of the processing failure and/or the type of defect detected are known, then these root causes may be tied to the fractal analysis and may be used for future reference purposes.

If the same label appears at opposite edges of the two-dimensional pixel (site) array 200, for example, an "infinite" cluster exists. In this way, the critical concentrations $p_c$ may be determined. By counting the number of clusters with s sites (pixels), the cluster distribution function may be obtained.

Figure 3:
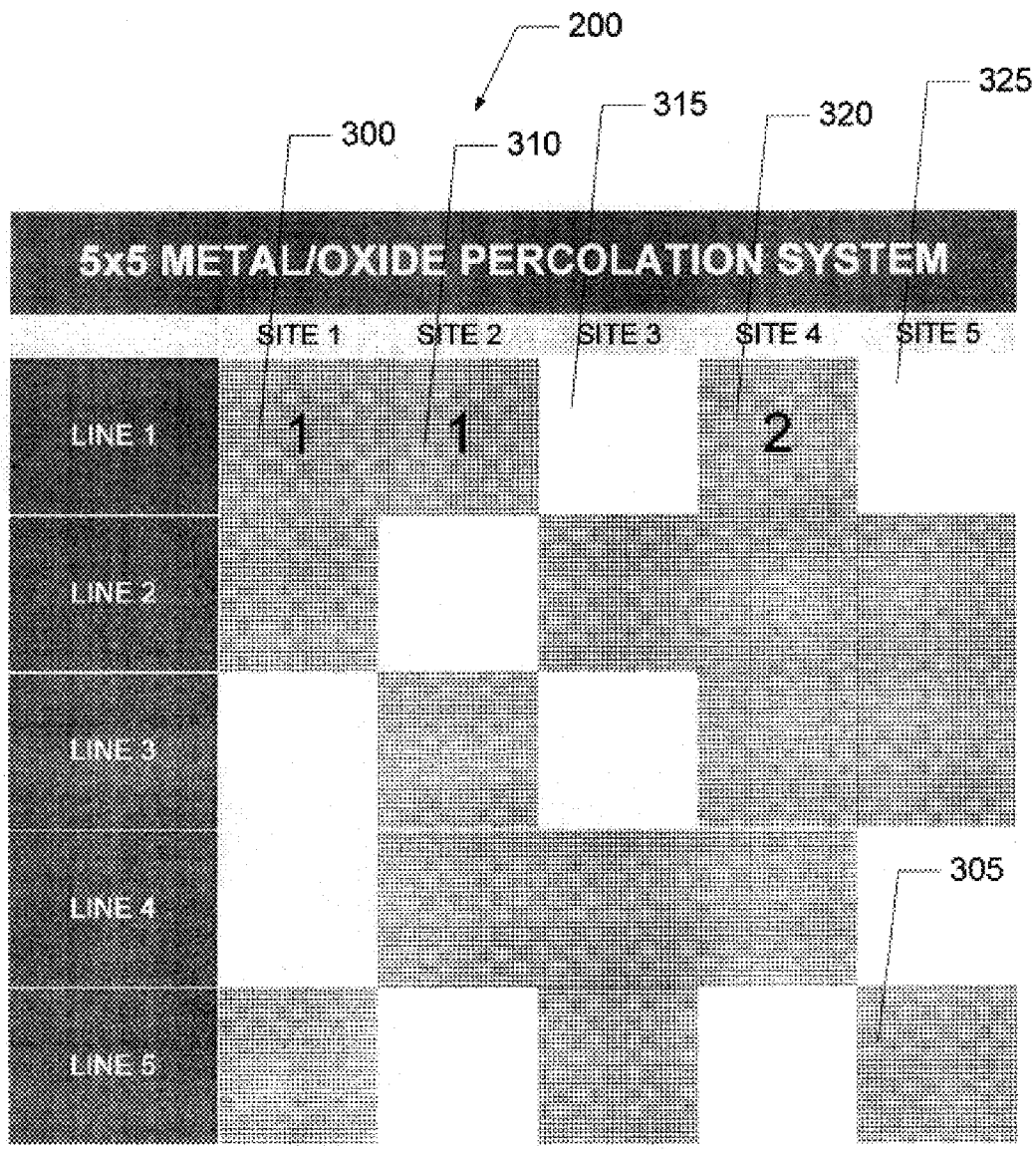

As an example of fractal filtering, the Hoshen-Kopelman method may be applied to the 5×5 metal/oxide percolation system shown in FIG. 2. As shown in FIG. 3, beginning at the upper left corner 300, and eventually ending at the lower right corner 305, cluster labels may be assigned to occupied sites such as sites 300, 310 and 320, for example. The first occupied site 300 gets the label 1, and the neighboring site 310 gets the same label since it belongs to the same cluster. The third site 315 is empty and the fourth site 320 is labeled 2. The fifth site 325 is empty.

Figure 4:
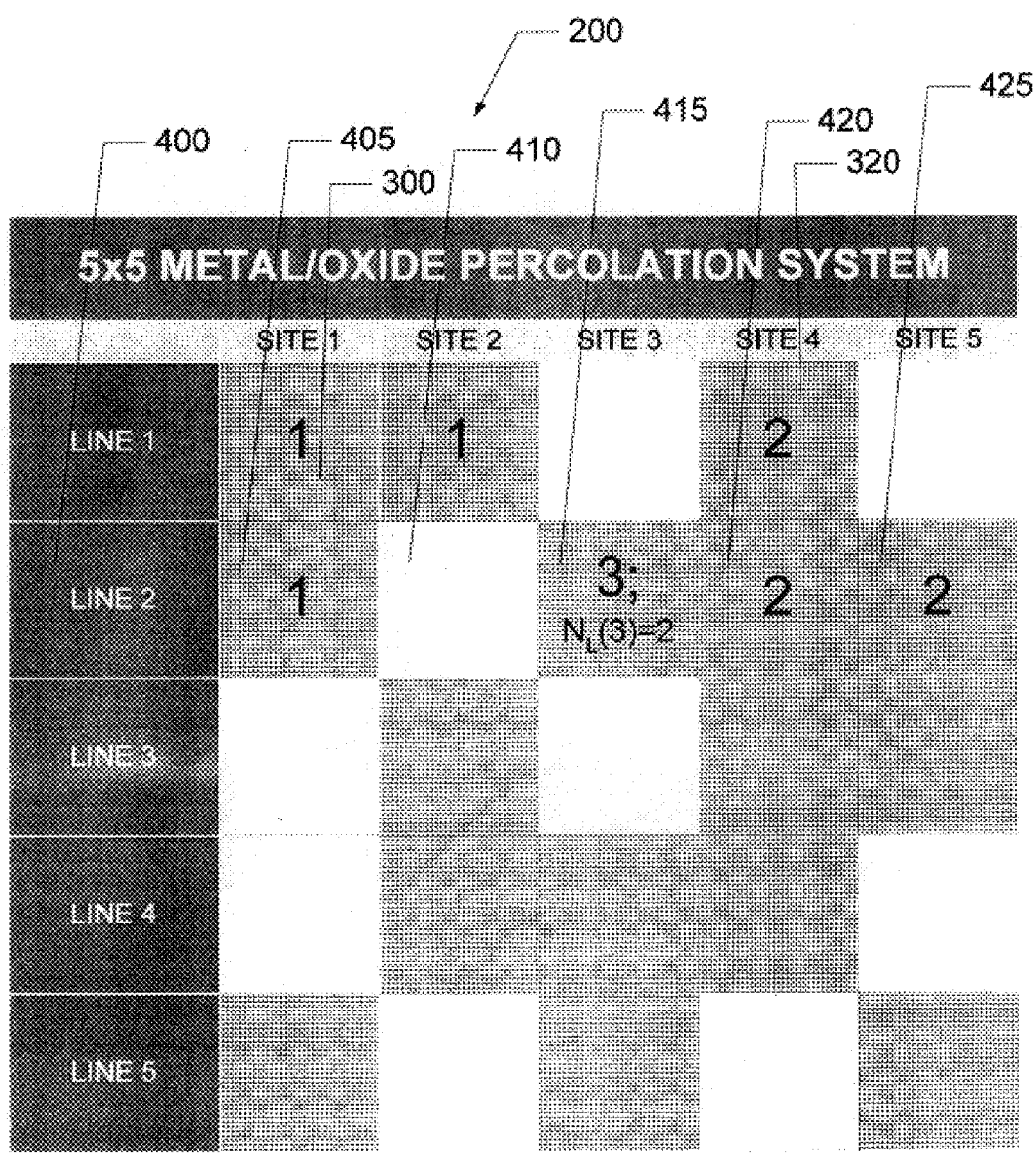

As shown in FIG. 4, in the second line 400, the first site 405 is connected to its neighbor 300 and is therefore labeled 1. The second site 410 is empty and the third site 415 is labeled 3. The fourth site 420 is now the neighbor of two sites, the third site 415 to the left, labeled 3, and the site 320 above, labeled 2. All three sites 415, 420 and 320 belong to the same cluster, which was first labeled 2. Accordingly, the fourth site 420 is also labeled 2 and a new array $N_L$ (k) is defined so that $N_L$ (3)=2, indicating that sites labeled 3 belong to the cluster labeled 2. The fifth site 425 is labeled 2.

Figure 5:
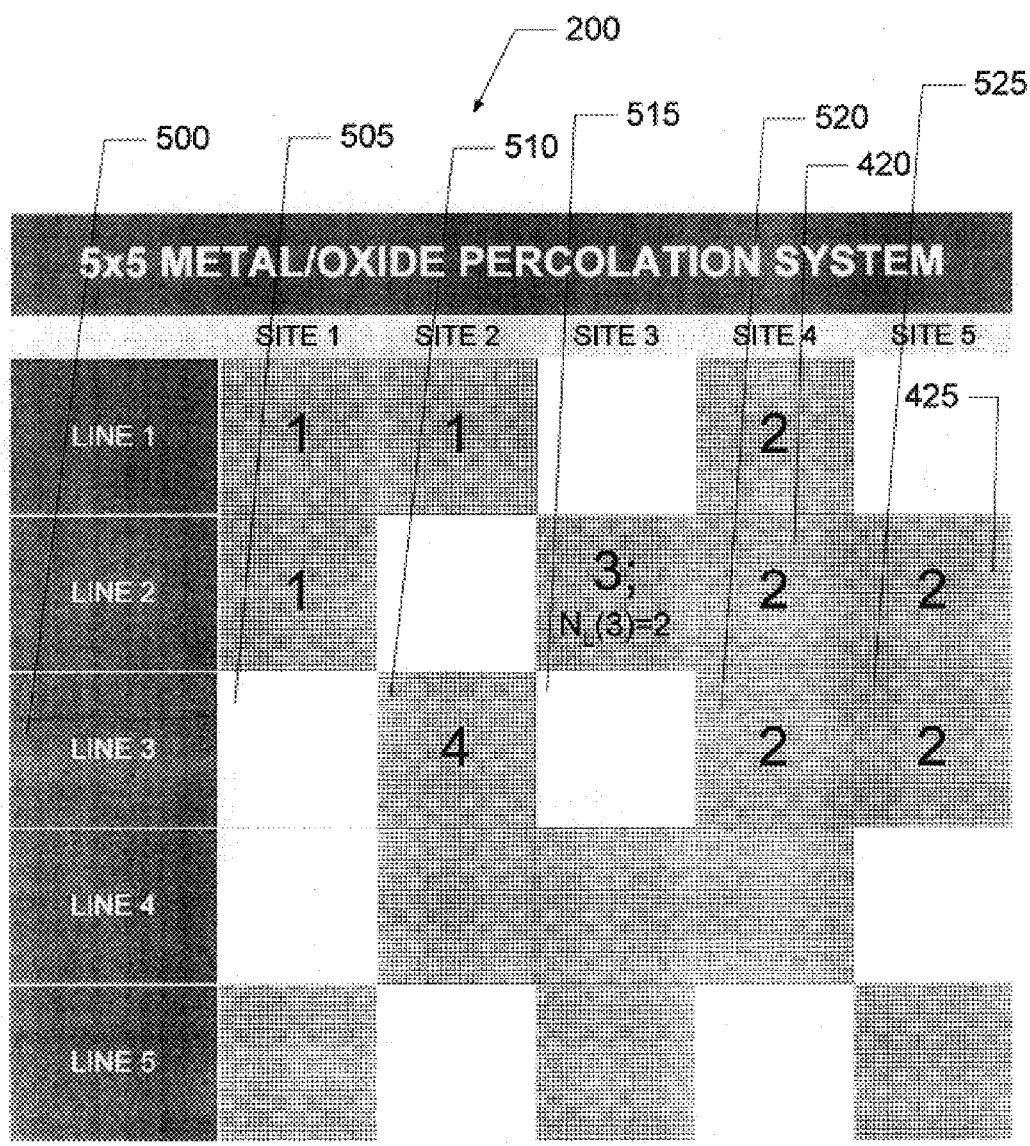

As shown in FIG. 5, in the third line 500, the first site 505 is empty and the second site 510 is labeled 4. The third site 515 is empty and the fourth site 520 is connected to its neighbor 420 and is therefore labeled 2. The fifth site 530 is connected to two neighboring sites, the fourth site 520 to the left and the site 425 above, both belonging to the cluster labeled 2 and, therefore, the fifth site 525 is also labeled 2.

Figure 6:
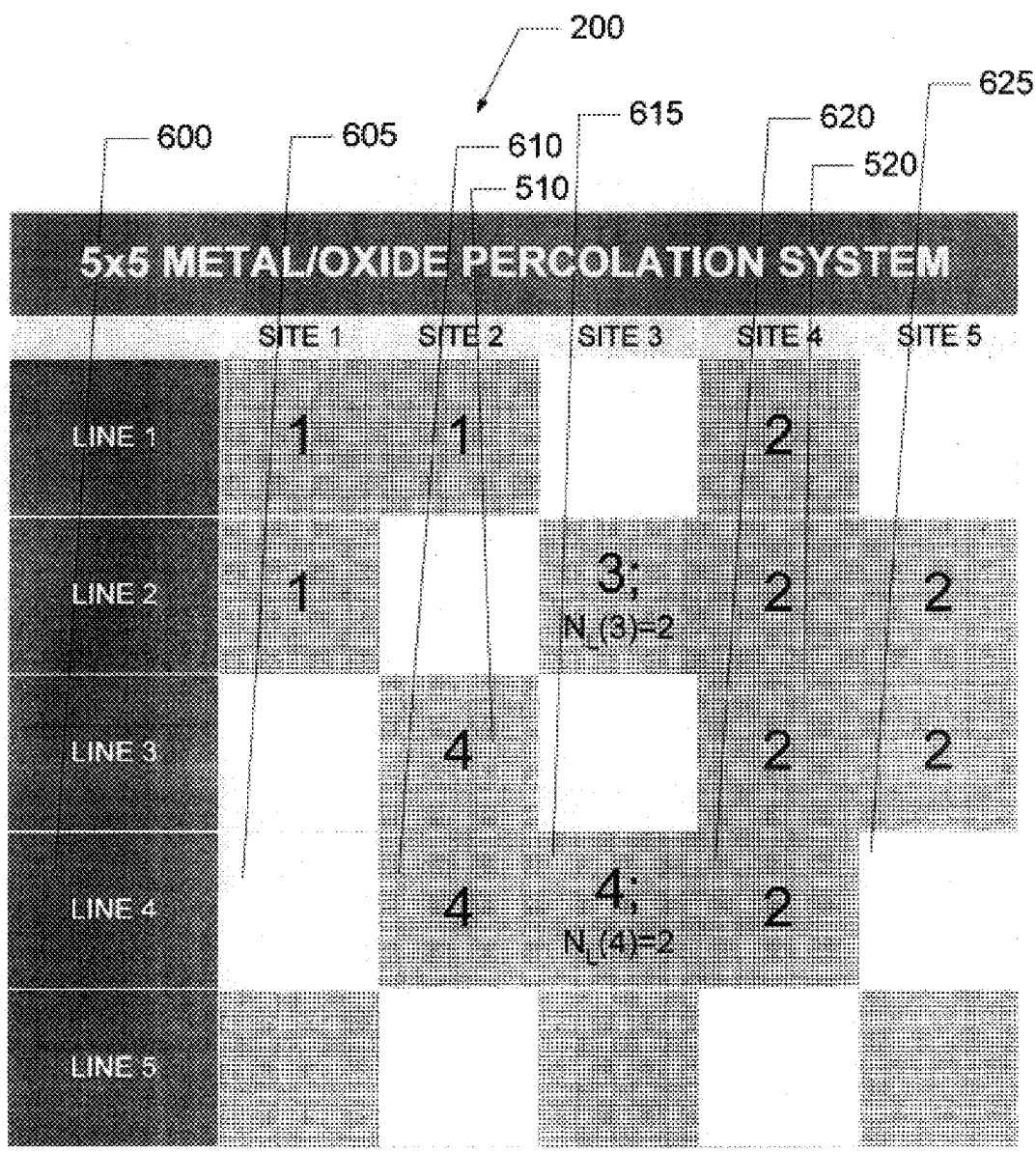

As shown in FIG. 6, in the fourth line 600, the first site 605 is empty and the second site 610 is connected to its neighbor 510 and is therefore labeled 4. The third site 615 is connected to its neighbor 610 and is therefore also labeled 4. The fourth site 620 is now the neighbor of two sites, the third site 615 to the left, labeled 4, and the site 520 above, labeled 2. All three sites 615, 620 and 520 belong to the same cluster, which was first labeled 2. Accordingly, the fourth site 620 is also labeled 2 and $N_L$ (4)=2, indicating that sites labeled 4 also belong to the cluster labeled 2. The fifth site 625 is empty.

Figure 7:
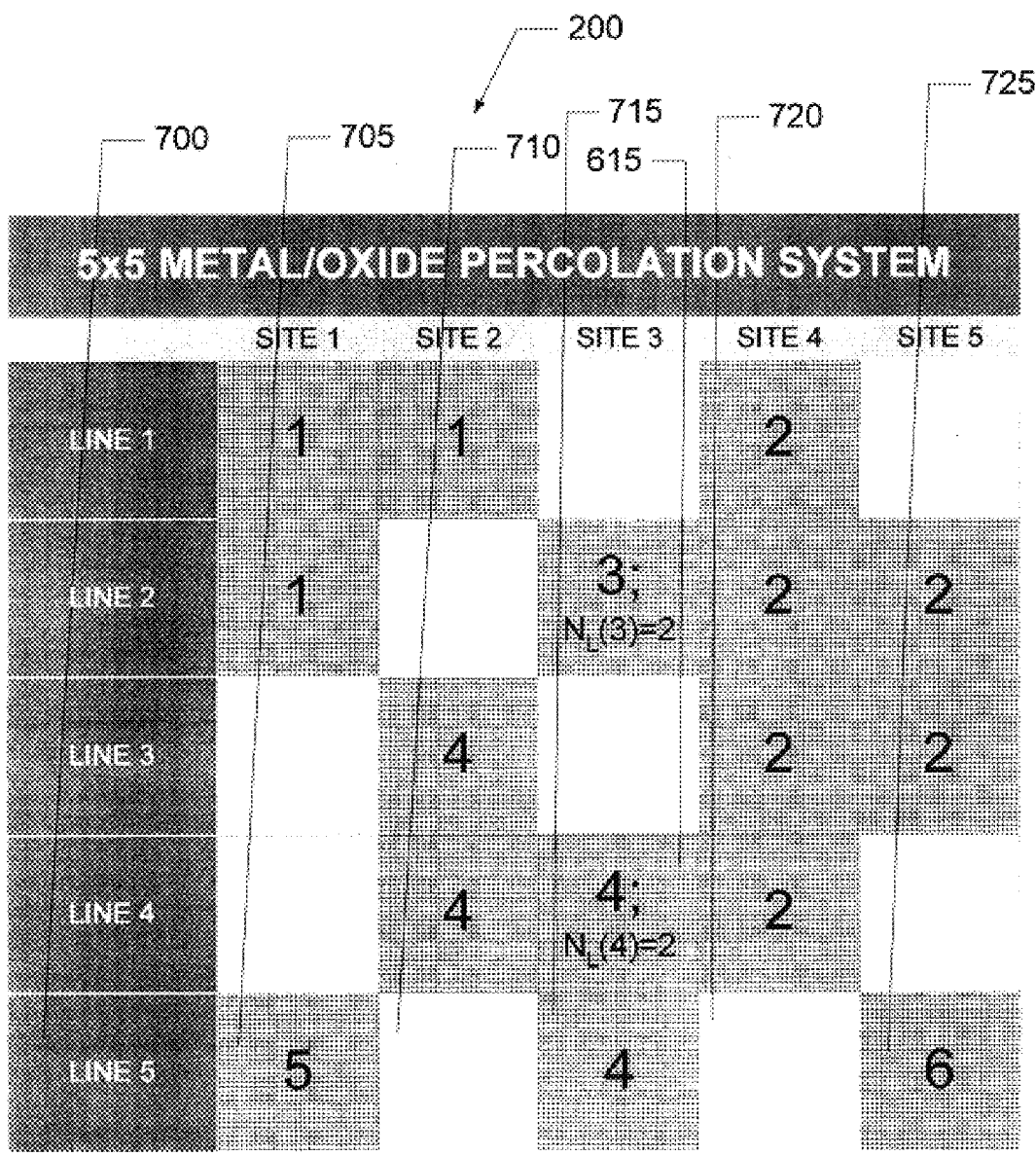

As shown in FIG. 7, in the fifth and last line 700, the first site 705 is labeled 5 and the second site 710 is empty. The third site 715 is connected to its neighbor 615 and is therefore labeled 4. The fourth site 720 is empty and the fifth site 725 is labeled 6.

Sites labeled 1, 2, 5 and 6 are not connected with sites having lower labels, and so the remainder of the array $N_L$ (k) may be defined so that $N_L$ (k)=k, for k=1, 2, 5 and 6. In other words, $N_L$ (1)=1, indicating that sites labeled 1 belong to the cluster labeled 1, $N_L$ (2)=2, indicating that sites labeled 2 belong to the cluster labeled 2, $N_L$ (5)=5, indicating that sites labeled 5 belong to the cluster labeled 5, and $N_L$ (6)=6, indicating that sites labeled 6 belong to the cluster labeled 6.

Figure 8:
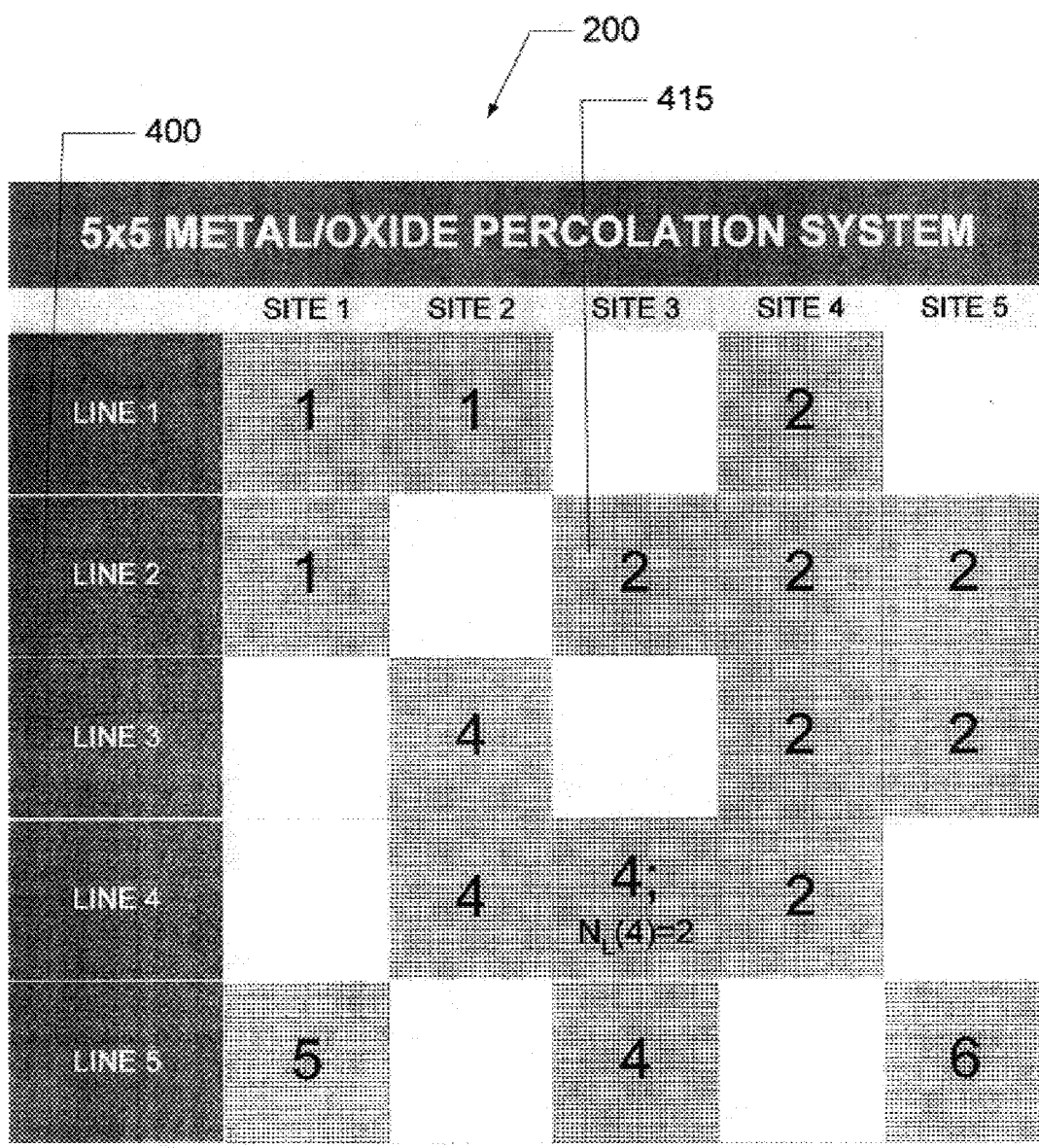
Figure 9:
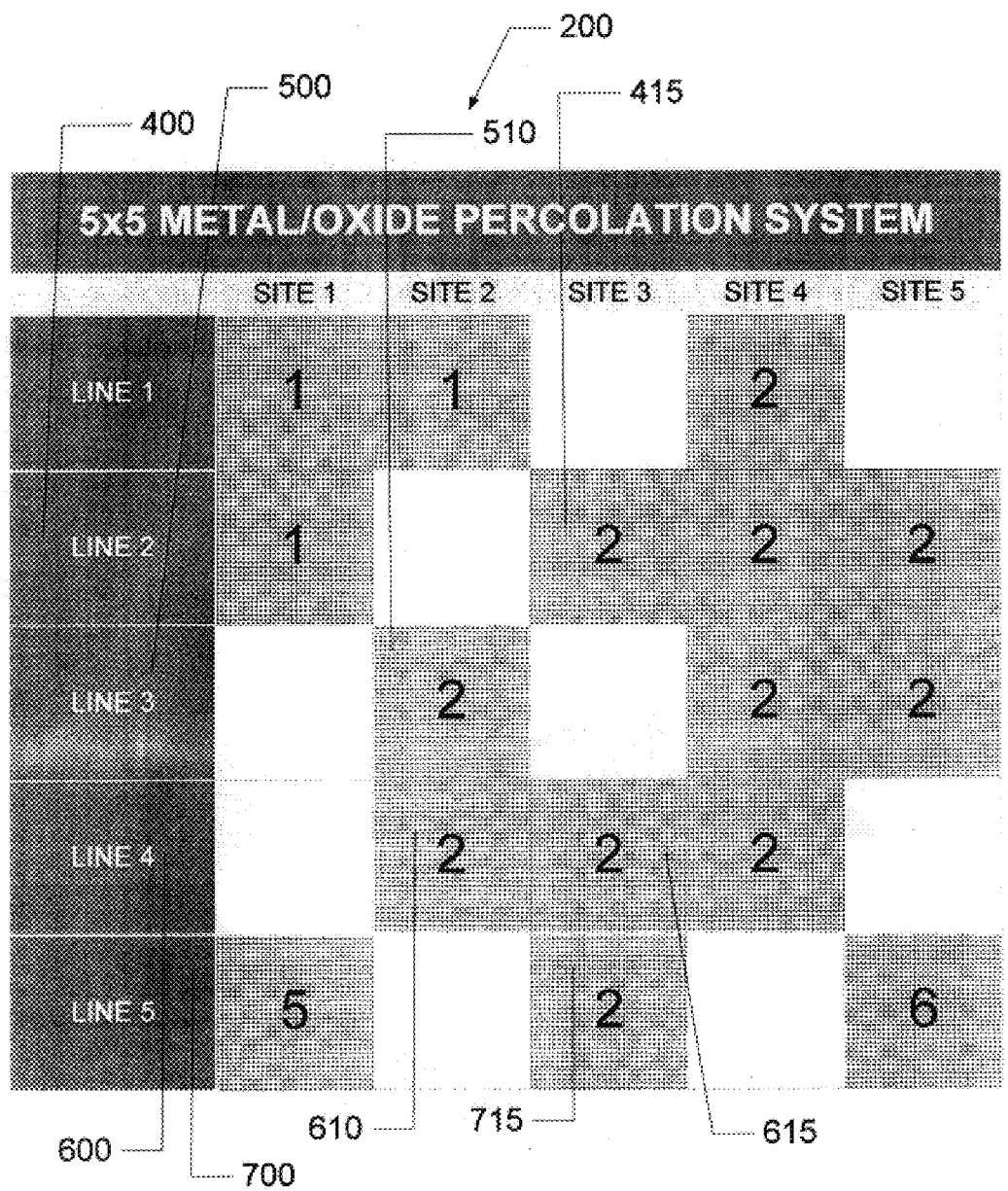

As shown in FIGS. 8 and 9, all the sites having $N_L$ (k)<k, for k=1,2, . . . ,6, may be updated and relabeled, starting with the smallest value of k for which $N_L$ (k)<k, and ending with the largest value of k for which $N_L$ (k)<k. For example, as shown in FIG. 4, the third site 415 in the second line 400 is labeled 3, and $N_L$ (3)=2, so that the third site 415 in the second line 400 is updated and relabeled 2, as shown in FIG. 8. Similarly, as shown in FIGS. 5, 6 and 7, the second site 510 in the third line 500, the second and third sites 610 and 615 in the fourth line 600, and the third site 715 in the fifth line 700 are all labeled 4, and $N_L$ (4)=2, so that the respective sites are updated and relabeled 2, as shown in FIG. 9. As shown by the final labeling in FIG. 9, there are thus four clusters labeled 1, 2, 5 and 6.

Figure 11:
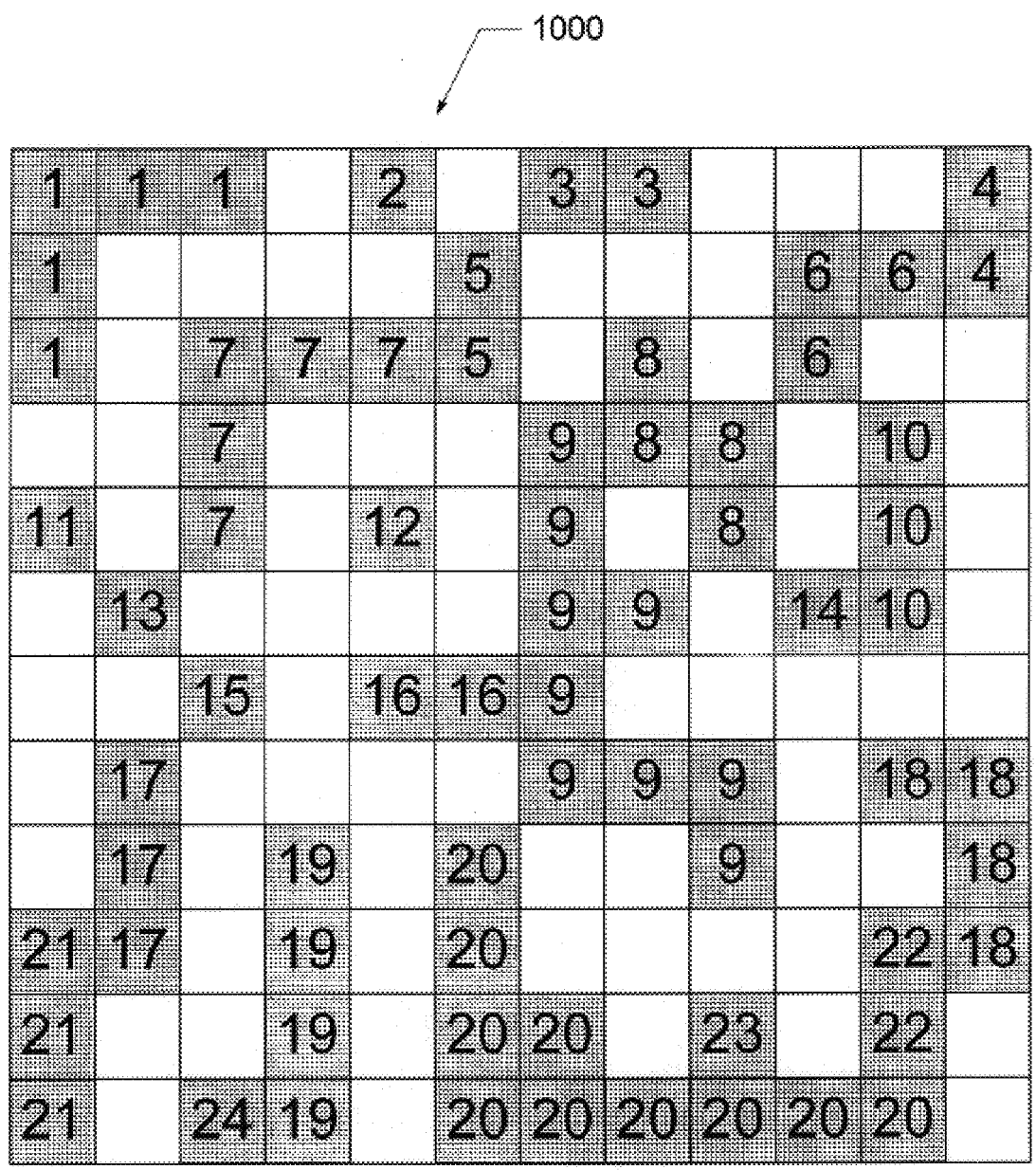

As another example of fractal filtering, the Hoshen-Kopelman method may be applied to a 12×12 metal/oxide percolation system, as shown in the two-dimensional pixel (site) array 1000 in FIG. 10. As shown in FIG. 11. cluster labels 1,2, . . . ,24 may be assigned to the occupied sites, for example. The array $N_L$ (k) may be defined so that $N_L$ (k)=k, for k=1,2,3,4,5,8,10,11,12,13,15,17,18, and 19. The remainder of the array $N_L$ (k) may be defined so that $N_L$ (6)=4, $N_L$ (7)=5, $N_L$ (9)=8, $N_L$ (14)=10, $N_L$(16)=8, $N_L$ (20)=18, $N_L$ (21)=17, $N_L$ (22)=18, $N_L$ (23)=18, and $N_L$ (24)=19. Note that $N_L$ (16)=9 would have been a possible assignment, but $N_L$ (9)=8, so $N_L$ (16)=8, since the smallest value on the right hand side of the equation is preferred. Similarly, $N_L$ (22)=20 would have been possible, but $N_L$ (22)=18 also, so $N_L$ (20)=18 is preferred. Moreover, $N_L$ (23)=20 again would have been possible, but $N_L$ (20)=18, so $N_L$ (23)=18 is similarly preferred.

Figure 12:
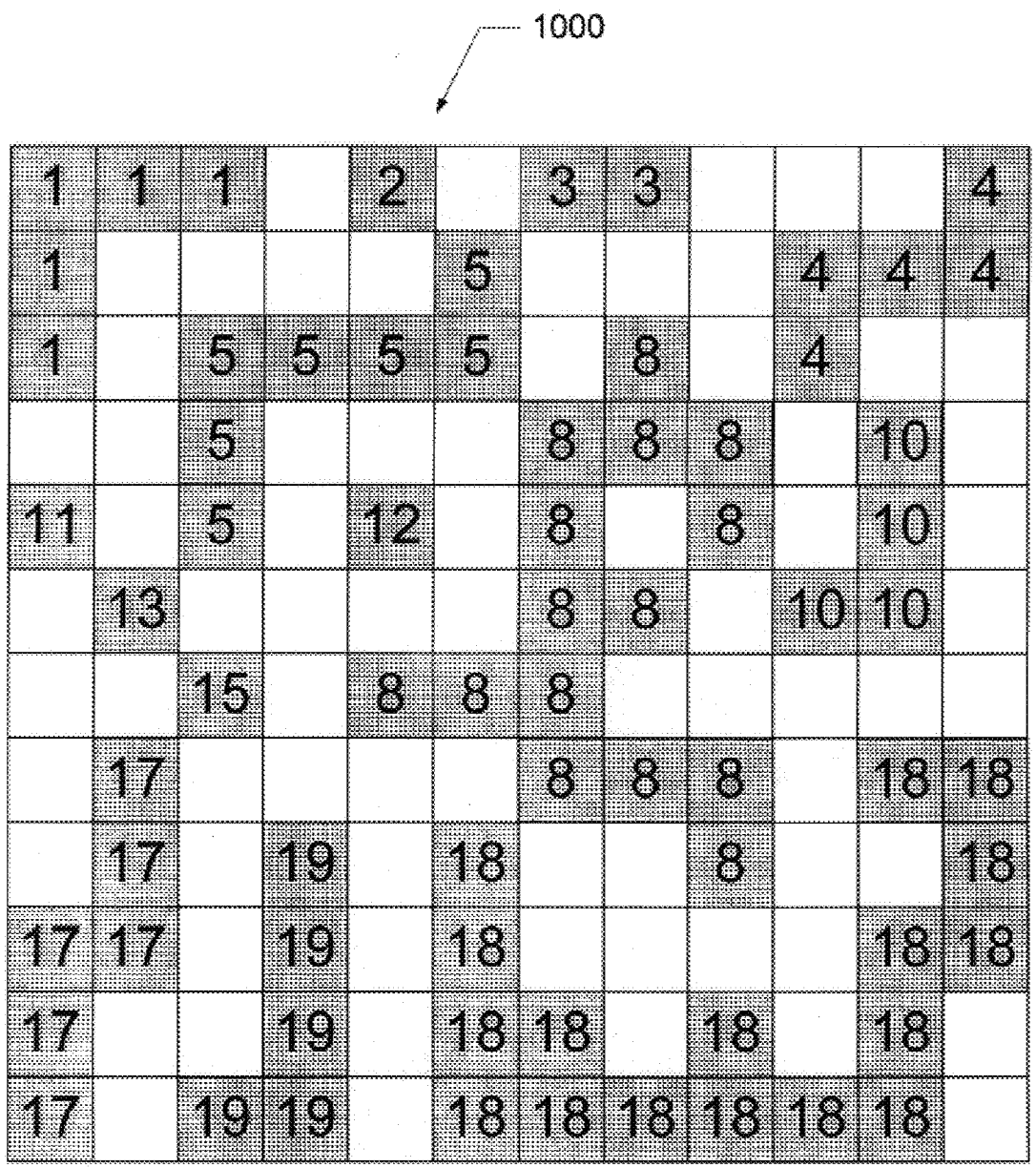

As shown in FIG. 12, all the sites having $N_L$ (k)<k, for k=1,2, . . . ,24, may be updated and relabeled, starting with the smallest value of k for which $N_L$ (k)<k, in this case k=6, since $N_L$ (6)=4, and ending with the largest value of k for which $N_L$ (k)<k, in this case k=24, since $N_L$ (24)=19. As shown by the final labeling in FIG. 12, there are thus fourteen clusters labeled 1, 2 3, 4, 5, 8, 10, 11, 12, 13, 15, 17, 18, and 19.

In another illustrative embodiment, the Ziff method, described. for example, in *Fractals and Disordered Systems*, edited by Armin Bunde and Shlomo Havlin (Springer-Verlag, Berlin, Heidelberg, New York, 1996), pp. 98–100, may be applied to the scan data 115, for example, enabling a classification of pixels (sites) in the scan data 115 that generates external directed perimeters for all the clusters in a percolation system. The fractally filtered scan data 115 may thus get sorted by clusters and a pattern may emerge. The fractally filtered scan data 115 may then be presented in a user-friendly graphical representation that may be analyzed by an engineer to determine the patterns. The fractally filtered scan data 115 may additionally and/or alternatively be stored and used for comparison purposes in an artificial intelligence (AI)-based system and/or a knowledge-based system. Once the root causes of the processing failure and/or the type of defect detected are known, then these root causes may be tied to the fractal analysis and may be used for future reference purposes.

Figure 13:
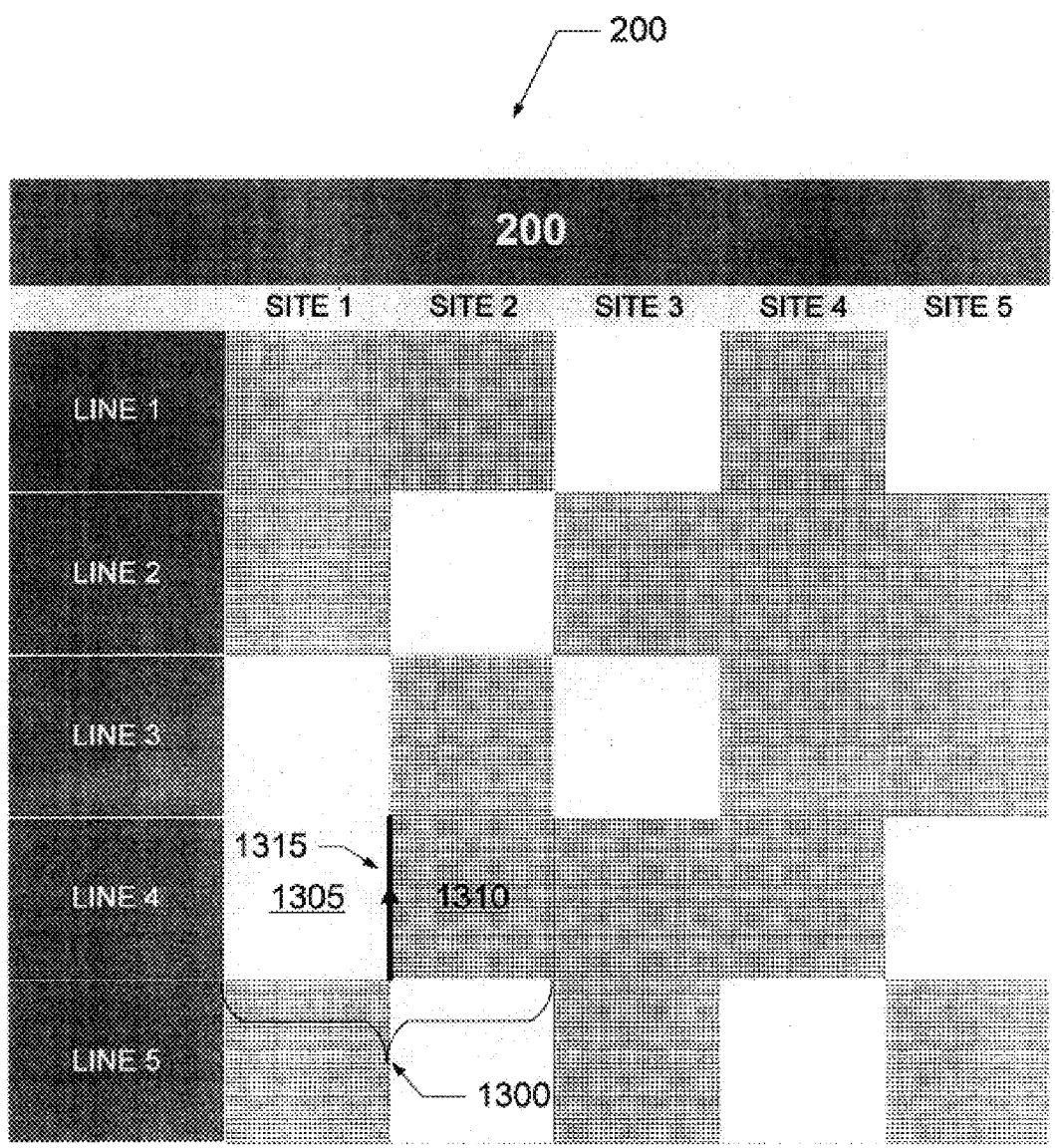

As another example of fractal filtering, the Ziff method may be applied to the 5×5 metal/oxide percolation system shown in FIG. 2. As shown in FIG. 13, two horizontal neighboring sites 1300 are chosen, with the left site 1305 empty and the right site 1310 occupied. The bond 1315 between them is directed upwards and represents the first step of a self-avoiding random walk (SAW) that will eventually generate the external perimeter 1900A (see FIG. 19) of the cluster 1900B (see FIG. 19).

Figure 14:
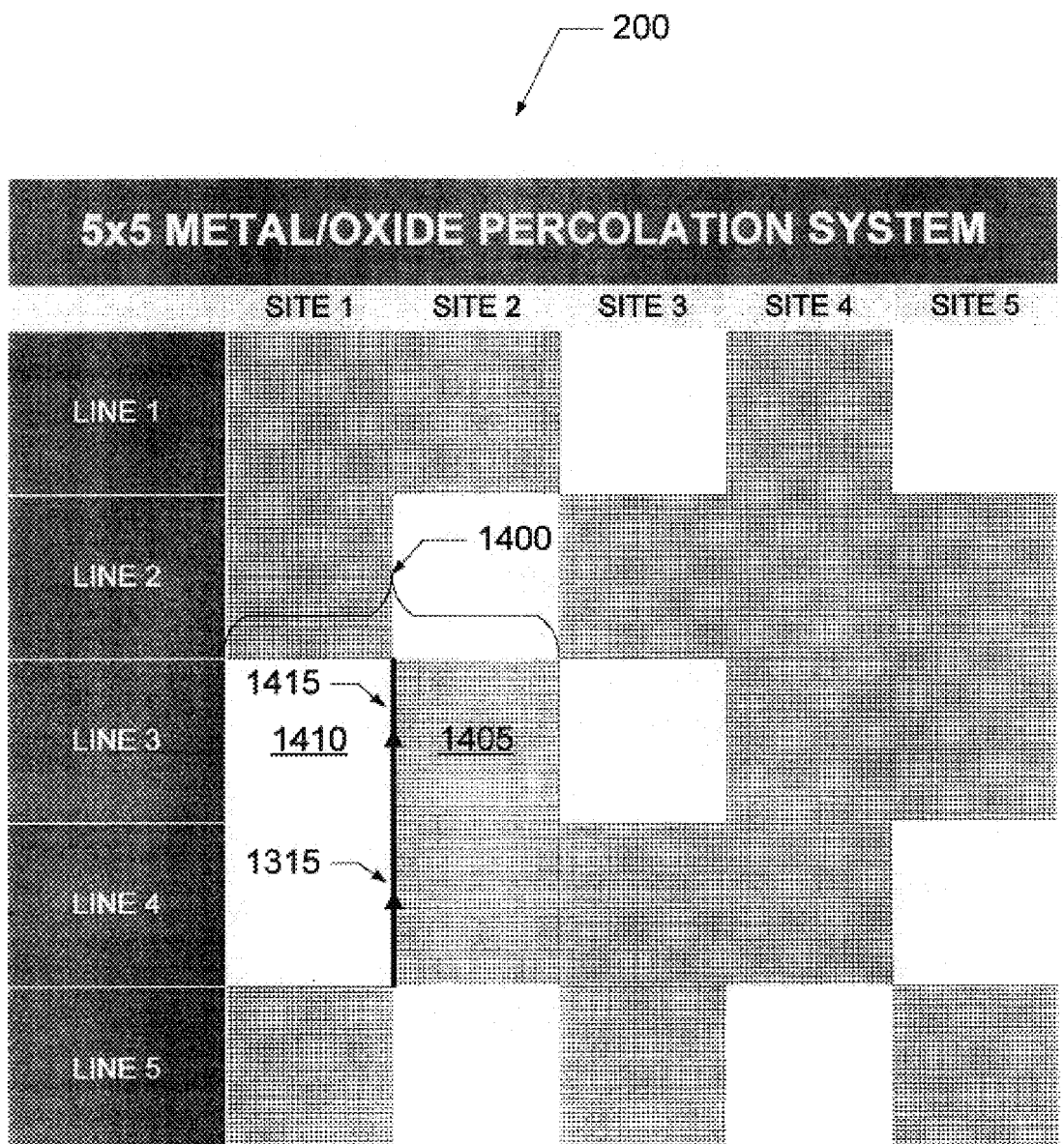

As shown in FIG. 14, in the second step of the SAW, the two neighboring sites 1400 in the direction of the bond 1315 are considered. If the right site 1405 is empty, the SAW steps to the right. If the right site 1405 is occupied, as is the case here, the left site 1410 is tested. If the left site 1410 is occupied, the SAW steps to the left. If the left site 1410 is empty, as is the case here, the SAW continues onward in the direction of the bond 1315, forming the next bond 1415.

Figure 15:
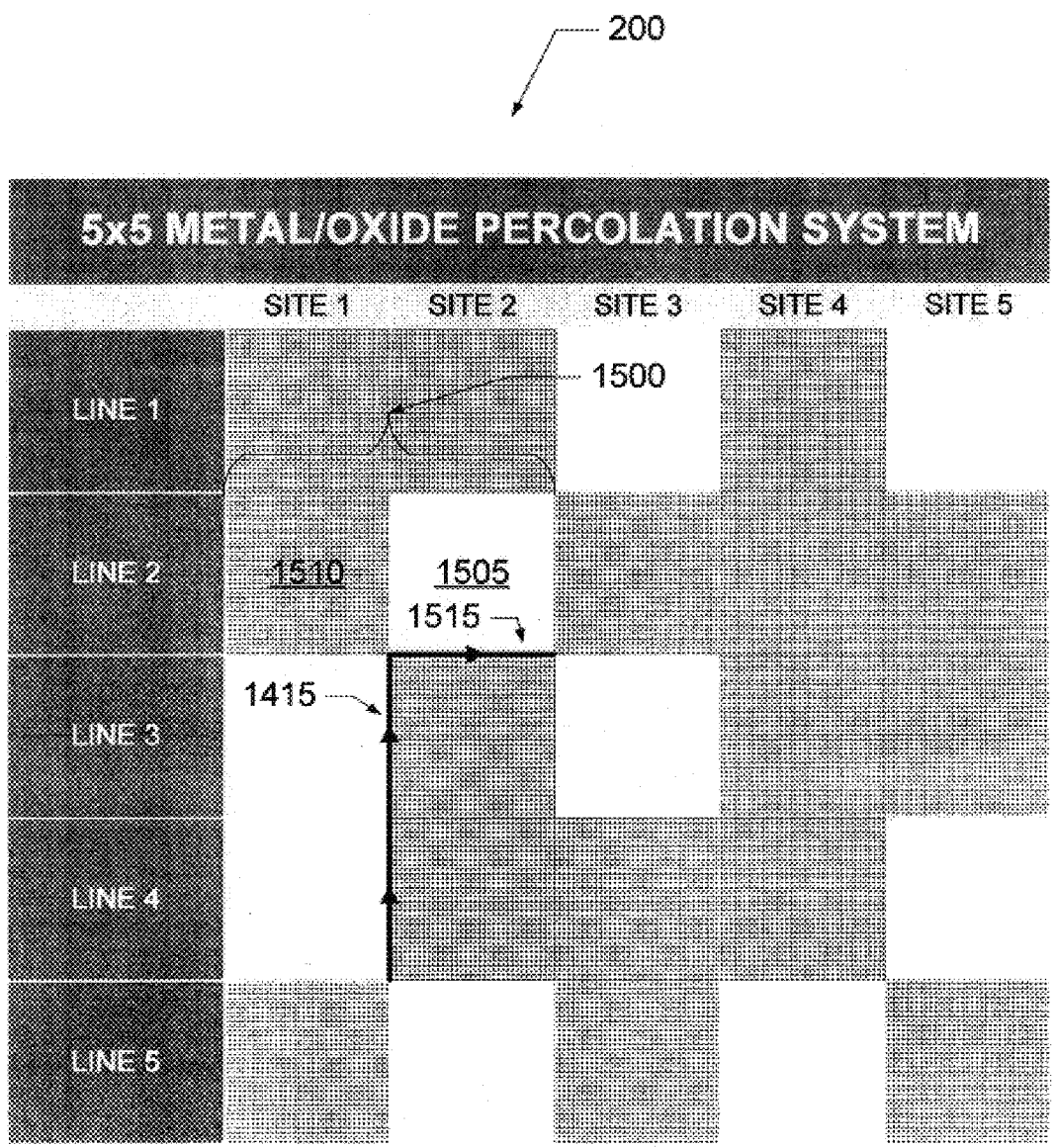

As shown in FIG. 15, in the third step of the SAW, the two neighboring sites 1500 in the direction of the bond 1415 are considered. Since the right site 1505 is empty. the SAW steps to the right, without testing the left site 1510, thus forming the next bond 1515.

Figure 16:
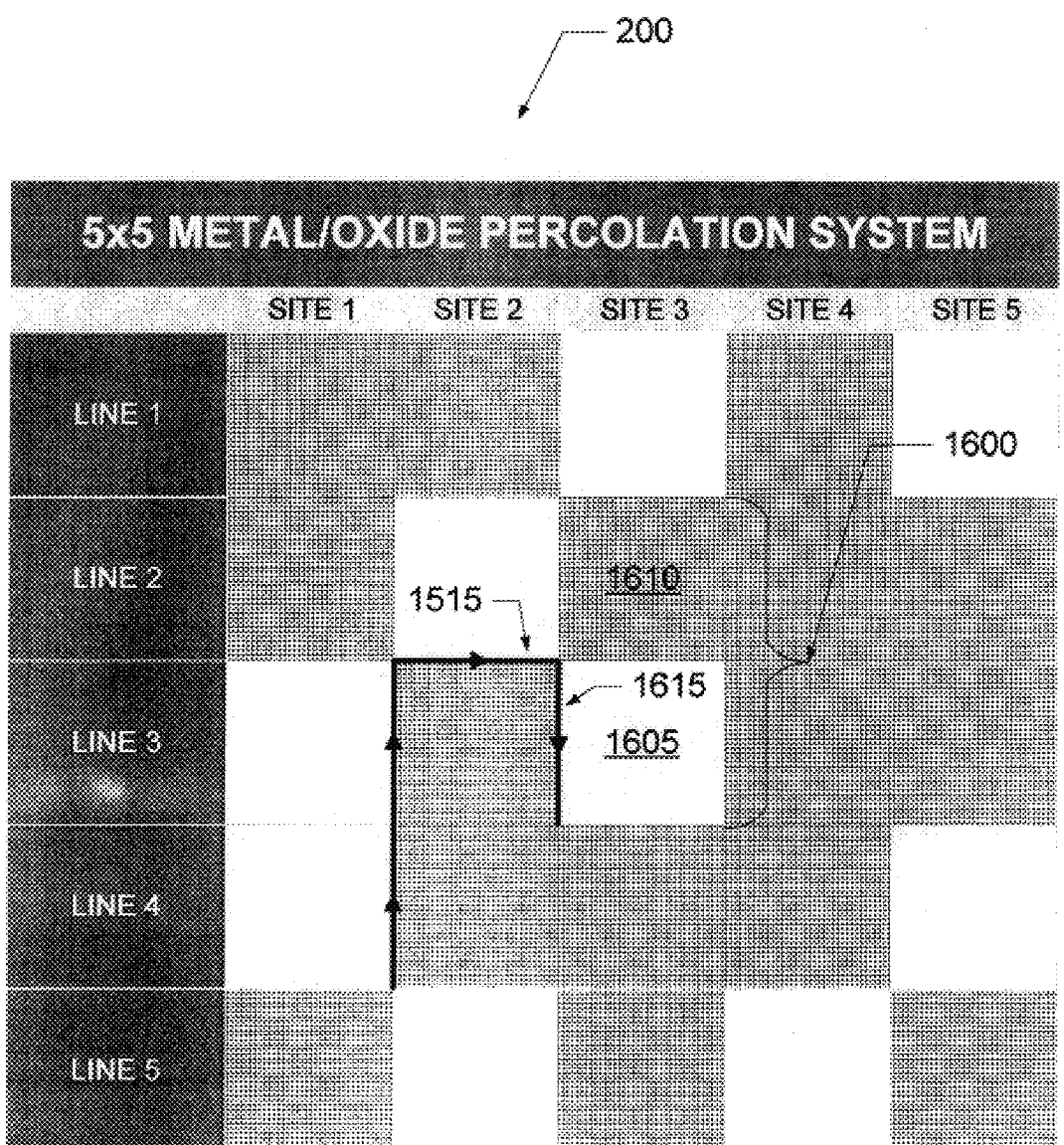

As shown in FIG. 16, in the fourth step of the SAW, the two neighboring sites 1600 in the direction of the bond 1515 are considered. Since the right site 1605 (right relative to the direction of the bond 1515) is empty, the SAW steps to the right, without testing the left site 1610 (left relative to the direction of the bond 1515), thus forming the next bond 1615.

Figure 17:
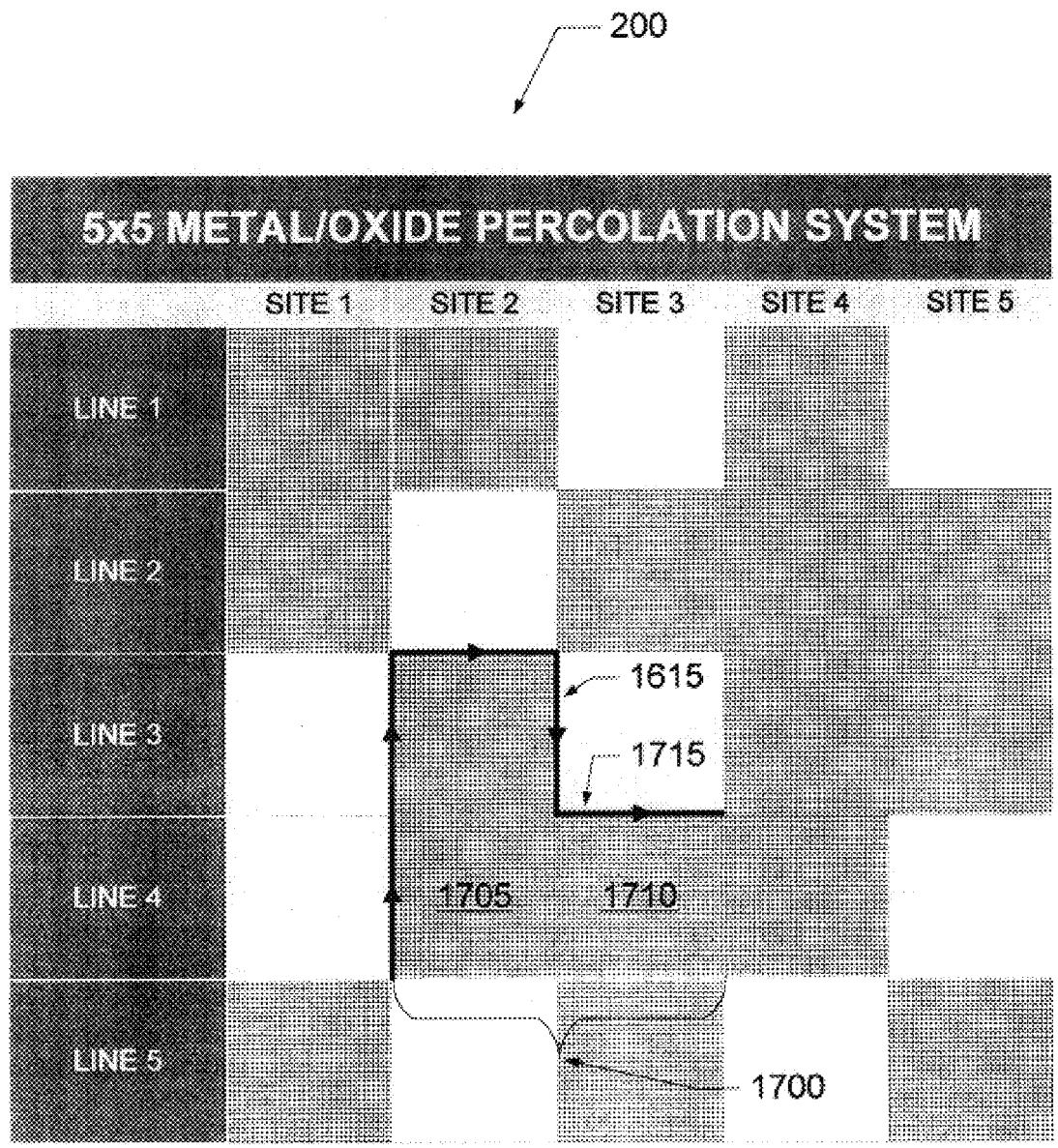

As shown in FIG. 17, in the fifth step of the SAW, the two neighboring sites 1700 in the direction of the bond 1615 are considered. Since the right site 1705 (right relative to the direction of the bond 1615) is occupied, the left site 1710 (left relative to the direction of the bond 1615) is tested. Since the left site 1710 is also occupied, the SAW steps to the left, forming the next bond 1715.

Figure 18:
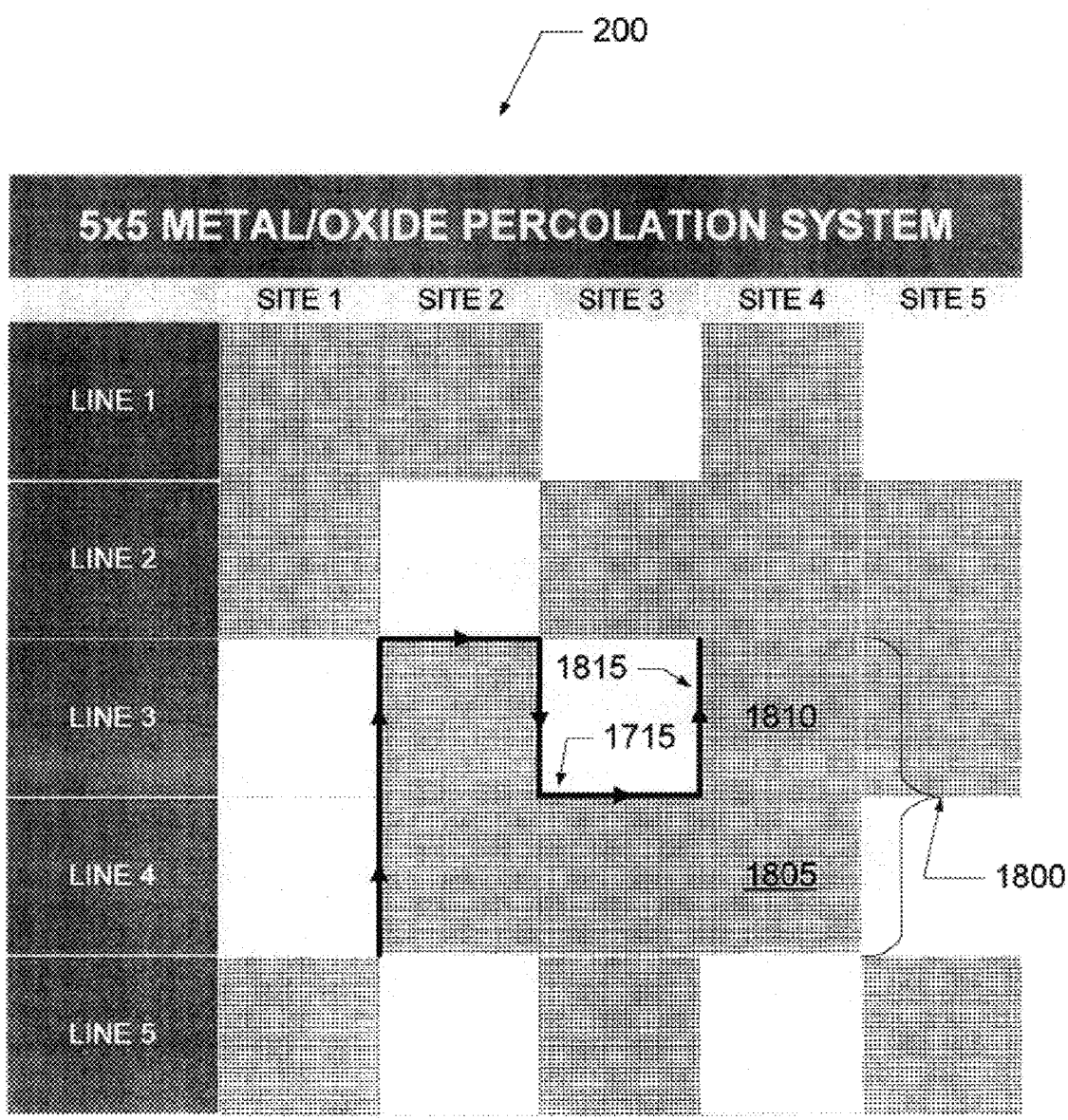
Figure 19:
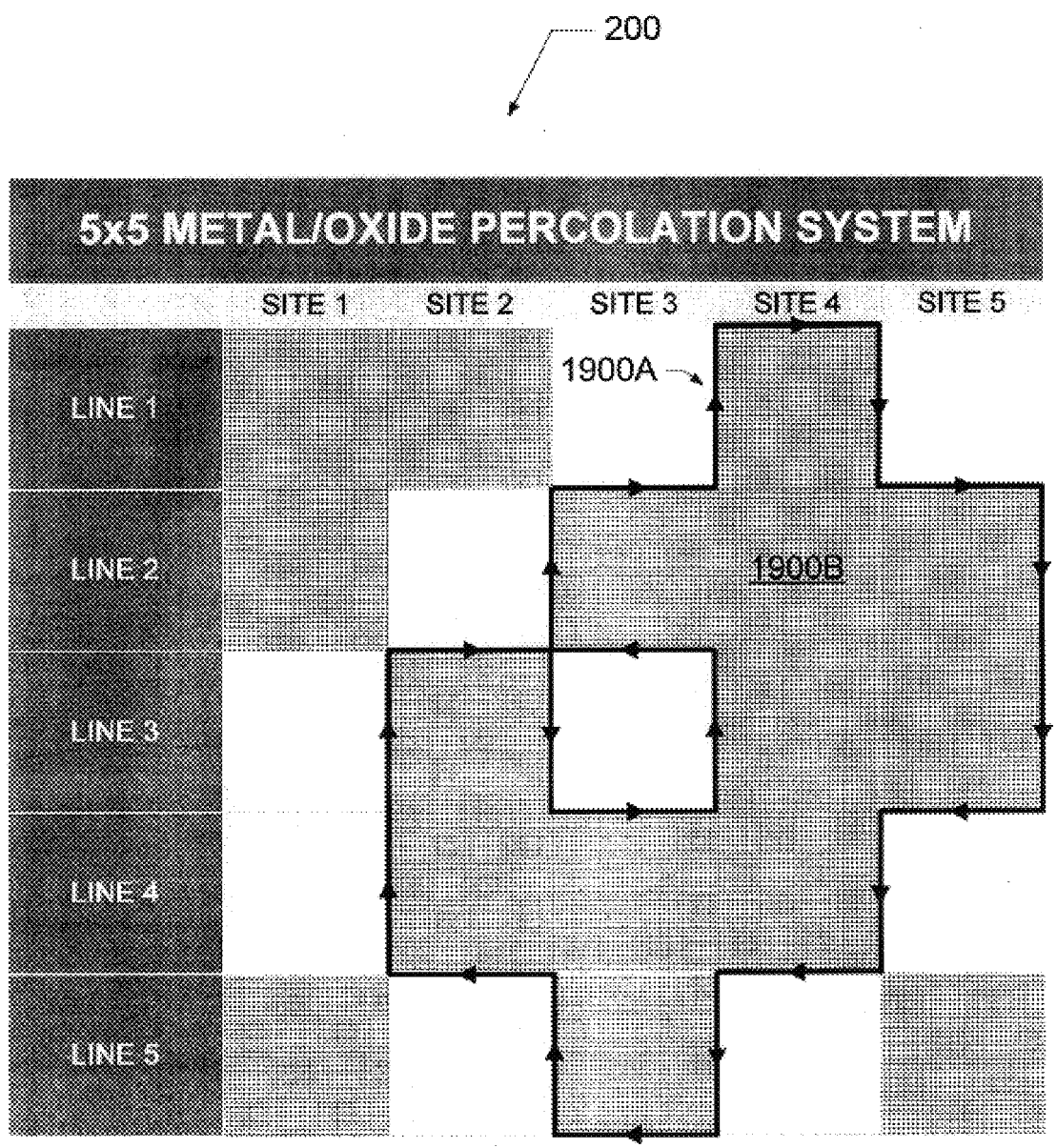

As shown in FIG. 18, in the sixth step of the SAW, the two neighboring sites 1800 in the direction of the bond 1715 are considered. Since the right site 1805 (right relative to the direction of the bond 1715) is occupied, the left site 1810 (left relative to the direction of the bond 1515) is tested. Since the left site 1810 is also occupied, the SAW steps to the left, forming the next bond 1815. The remainder of the SAW is accomplished in similar fashion, resulting in the generation of the external perimeter 1900A of the cluster 1900B, as shown in FIG. 19.

Figure 20:
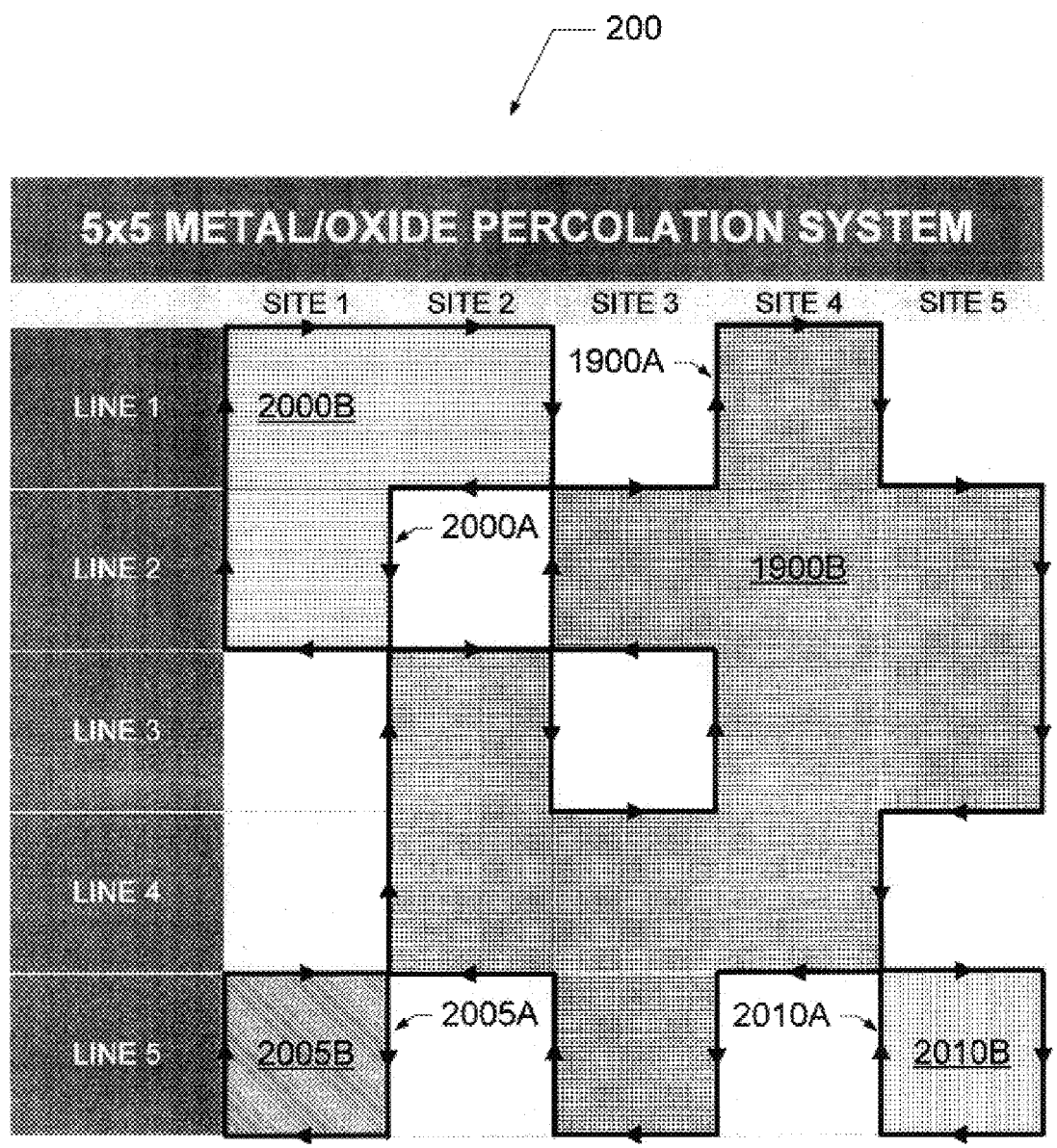

As shown in FIG. 20, the Ziff method may be used to generate perimeters 2000A, 1900A, 2005A and 2010A for the respective clusters 2000B, 1900B, 2005B and 2010B. Note that the respective clusters 2000B, 1900B. 2005B and 2010B classified by the Ziff method correspond exactly to the four clusters labeled by 1, 2, 5 and 6 classified by the Hoshen-Kopelman method, as shown in FIG. 9., for example.

Figure 21:
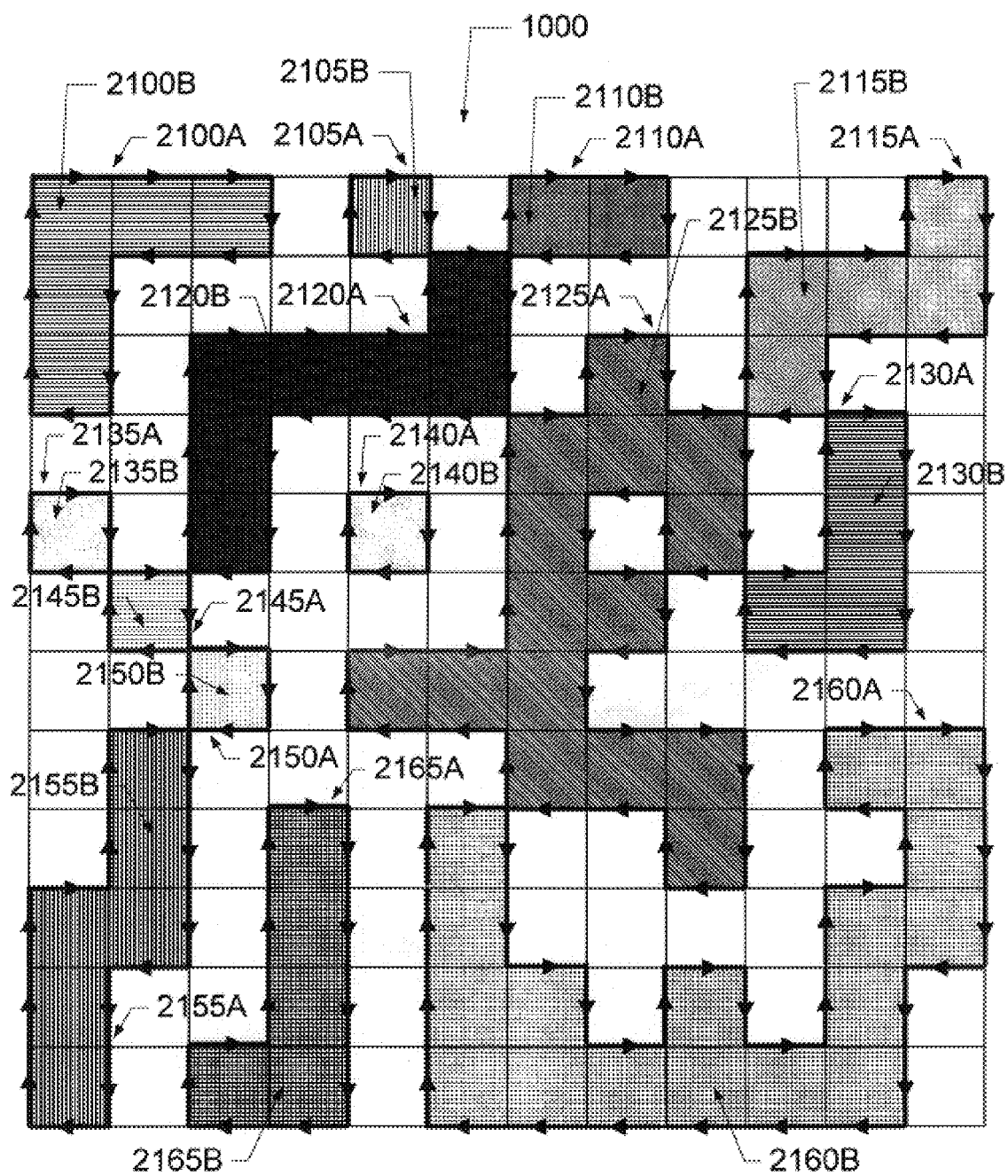

As shown in FIG. 21, the Ziff method may be used to generate perimeters 2100A, 2105A, 2110A, 2115A, 2120A, 2125A, 2130A, 2135A, 2140A, 2145A, 2150A, 2155A, 2160A and 2165A for the respective clusters 2100B, 2105B, 2110B, 2115B, 2120B, 2125B, 2130B, 2135B, 2140B, 2145B, 2150B, 2155B, 2160B and 2165B. Note that the respective clusters 2100B, 2105B, 2110B, 2115B, 2120B. 2125B, 2130B, 2135B, 2140B, 2145B, 2150B, 2155B, 2160B and 2165B classified by the Ziff method correspond exactly to the fourteen clusters labeled 1, 2, 3, 4, 5, 8, 10, 11, 12, 13, 15, 17, 18, and 19 classified by the Hoshen-Kopelman method, as shown in FIG. 12, for example.

In alternative embodiments, other fractal filtering and fractal analysis methods may be employed. Examples of such methods include the Leath method, deterministic fractal models (such as the Sierpinski gasket, the Mandelbrot-Given fractal, the modified Koch curve, the hierarchical model and the node-link-blob model), the series expansion method, small-cell renormalization, Potts model field theory and the $\epsilon$ expansion, and anomalous dynamical percolation methods, described, for example, in *Fractals and Disordered Systems*, edited by Armin Bunde and Shlomo Havlin (Springer-Verlag, Berlin, Heidelberg, New York, 1996), p. 100–10, 114–17.

Fractal filtering in the defect data manipulation and fractal filtering step 120 may reduce and/or eliminate false signals due to metal grains at interfaces between metal and oxide, for example, in the fabrication of certain types of semiconductor devices such as transistors. Fractal filtering in the defect data manipulation and fractal filtering step 120 may also enable the detection of particles and/or particulates on a workpiece 100 that has surface granularity, and/or on a workpiece containing surface topography. In addition, for particles and/or particulates near the minimum-size detection limit, fractal filtering in the defect data manipulation and fractal filtering step 120 may enable the detection of those particles and/or particulates that are present while reducing and/or eliminating the detection of non-existent particles and/or particulates (false counts).

Figure 22:
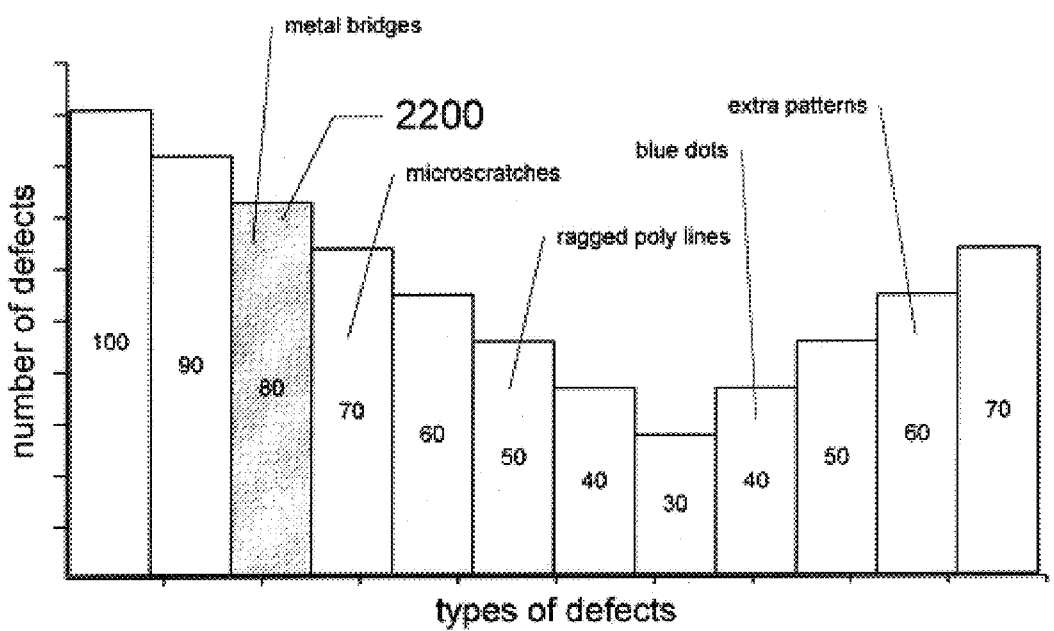
Figure 24:
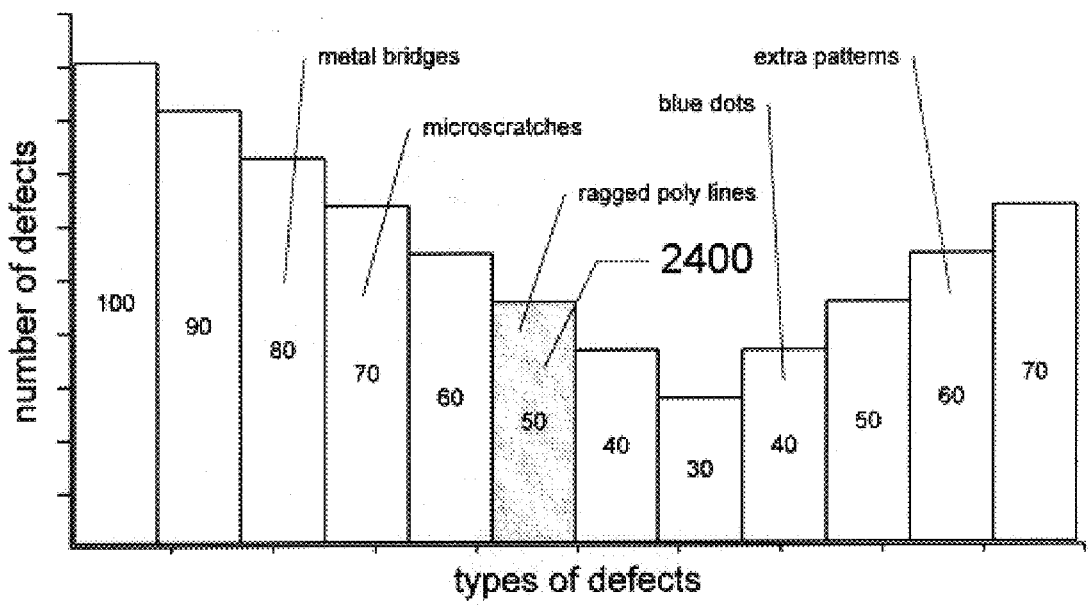

As shown in FIG. 1, the output signal 125 is sent from the defect date manipulation and fractal filtering step 120 to a first defect data display step 130. In the first defect data display step 130, the output signal 125 may be displayed, for example, by being presented in the form of a histogram, as illustrated in FIGS. 22 and 24. showing both the count number (defect counts 145) and the types of defects represented by the output signal 125. As shown in FIG. 22, in one illustrative embodiment, the number of metal bridges (shown shaded at 2200) formed between features formed on the workpiece 100 is about 80, in the location scanned, for the duration of the scan. Similarly, as shown in FIG. 24, the number of ragged poly lines (shown shaded at 2400) is about 50, in the location scanned, for the duration of the scan.

The display of the output signal 125 in the first defect data display step 130 may be used to alert an engineer of the need to adjust the processing performed in the processing step j 105 to reduce at least one type of defect detected in the inspection step j 110. The engineer may also alter, for example, the classification of the scan data 115, in the defect date manipulation and fractal filtering step 120, according to the type of defect detected, affecting the output signal 125 produced.

As shown in FIG. 1, a feedback control signal 135 is sent from the first defect data display step 130 to the processing step j 105 to adjust the processing performed in the processing step j 105 to reduce at least one type of defect detected in the inspection step j 110. In one illustrative embodiment, as shown in FIG. 22, when the number of metal bridges (shown shaded at 2200) formed between features formed on the workpiece 100 exceeds a predetermined value, for example, about 80, the feedback control signal 135 may act to cause the processing performed in the processing step j 105 to increase the overetch time. In another illustrative embodiment, as shown in FIG. 24, when the number of ragged poly lines (shown shaded at 2400) formed on the workpiece 100 exceeds a predetermined value, for example, about 50. the feedback control signal 135 may act to cause the processing performed in the processing step j 105 to decrease the poly etch time.

As shown in FIG. 1, the workpiece 100 is sent from the inspection step j 110 to a processing step j+1 140. In the processing step j+1 140, the workpiece 100 undergoes another one of the total number N of processing steps, such as masking, etching, depositing material and the like, used to form the finished workpiece 100. As shown in FIG. 1, the workpiece 100 is then sent from the processing step j+1 140.

Figure 23:
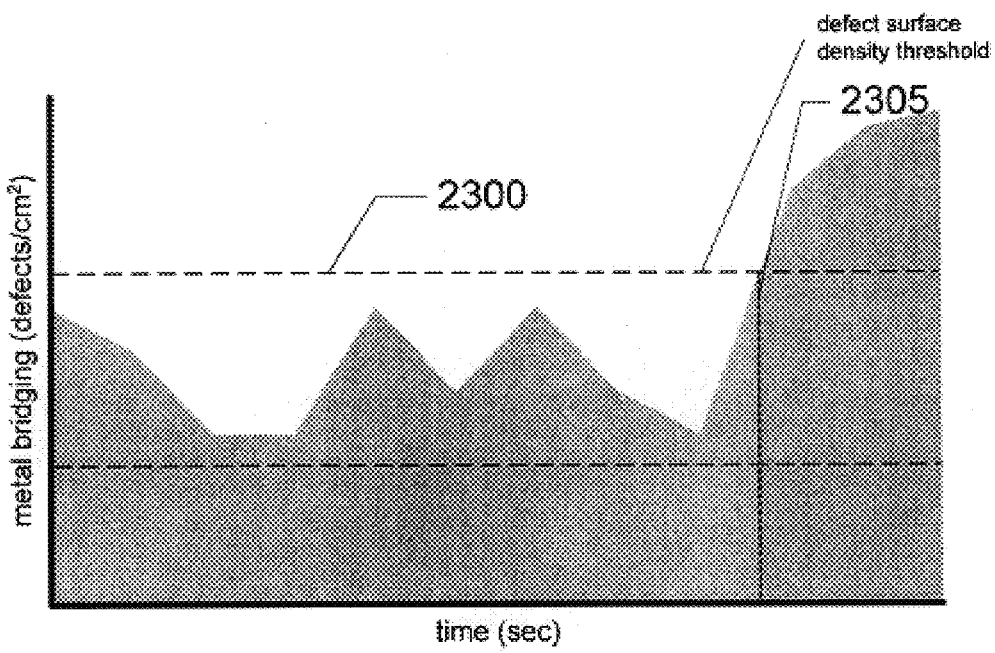

As shown in FIG. 1, in addition to, and/or instead of, the feedback control signal 135, the defect counts 145 may be sent from the first defect data display step 130 and may then be delivered to a second defect data display step 150. In the second defect data display step 150, the defect counts 145 may be displayed, for example, by being presented in the form of a graph, as illustrated in FIG. 23, showing the number of defects/$cm^2$ (defect surface density) on the surface of the workpiece 100 input into the inspection step j plotted as a function of time (measured in seconds). As shown in FIG. 23, in one illustrative embodiment, the number of metal bridges/$cm^2$ formed between features formed on the workpiece 100 may eventually cross the defect surface density threshold 2300 (shown in dashed phantom) at the time 2305 (shown in dotted phantom).

The display of the defect counts 145 in the second defect data display step 150 may be used to alert an engineer of the need to adjust the processing performed in the processing step j 105 to reduce at least one type of defect detected in the inspection step 110. The engineer may also adjust, for example, the defect surface density threshold 2300 (shown in dashed phantom). The engineer may also select, for example, the type of defect whose defect counts 145 are to be displayed in the second defect data display step 150.

As shown in FIG. 1, a feedback control signal 155 may be sent from the second defect data display step 150 to the processing step j 105 to adjust the processing performed in the processing step j 105 to reduce at least one type of defect detected in the inspection step j 110. In one illustrative embodiment, as shown in FIG. 23, when the number of metal bridges/$cm^2$ formed between features crosses the defect surface density threshold 2300 (shown in dashed phantom) at the time 2305 (shown in dotted phantom), the feedback control signal 155 may act to cause the processing performed in the processing step j 105 to increase the overetch time.

Figure 25:
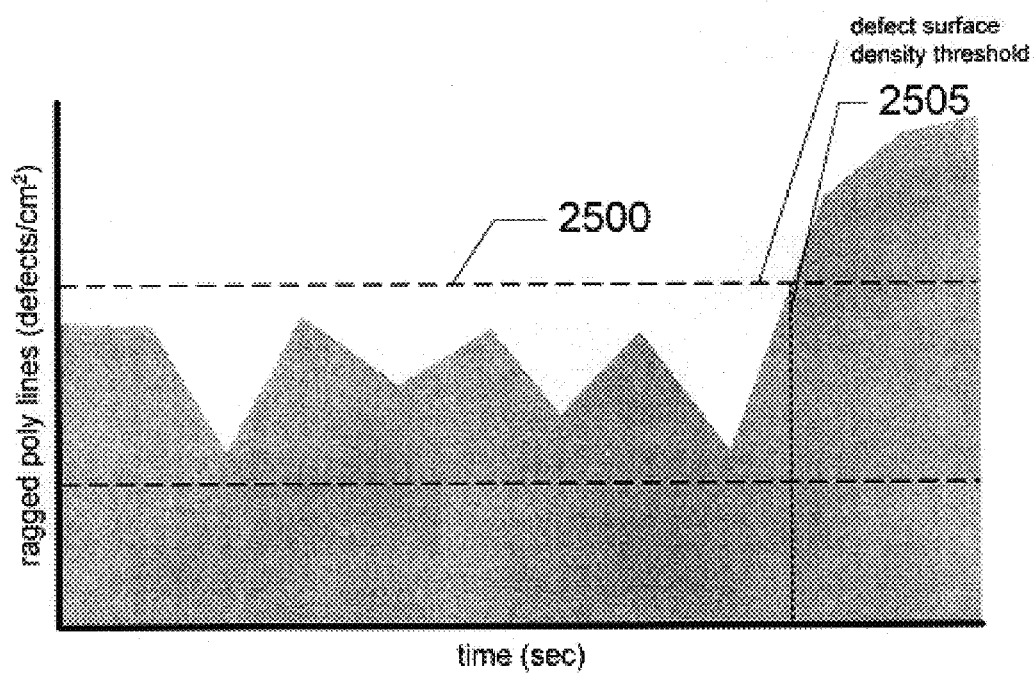

As shown in FIG. 25, in another illustrative embodiment, the number of ragged poly lines/$cm^2$ formed on the workpiece 100 may eventually cross the defect surface density threshold 2500 (shown in dashed phantom) at the time 2505 (shown in dotted phantom). In this illustrative embodiment, the feedback control signal 155 may act to cause the processing performed in the processing step j 105 to decrease the poly etch time.

In one illustrative embodiment, in both the first and second defect data display steps 130 and 150, the engineer may be provided with advanced process data monitoring capabilities, such as the ability to provide historical parametric data in a user-friendly format. as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

As shown in FIGS. 22 and 24, in yet another illustrative embodiment, the number of metal bridges (shown shaded at 2200 in FIG. 22) formed between features formed on the workpiece 100 is about 80, and the number of ragged poly lines (shown shaded at 2400 in FIG. 24) formed on the workpiece 100 is about 50, in the location scanned, for the duration of the scan. As shown in FIGS. 23 and 25, in this illustrative embodiment, the number of metal bridges/cm$^2$ formed between features formed on the workpiece 100 eventually crosses the defect surface density threshold 2300 (shown in dashed phantom in FIG. 23) at the time 2305 (shown in dotted phantom in FIG. 23), and the number of ragged poly lines/cm$^2$ formed on the workpiece 100 eventually crosses the defect surface density threshold 2500 (shown in dashed phantom in FIG. 25) at the time 2505 (shown in dotted phantom in FIG. 25). In this illustrative embodiment, as shown in FIG. 1, the feedback control signal 155 may act to cause the processing performed in the processing step j 105 to both increase the overetch time of the metal lines and decrease the poly etch time, for example, when the processing performed in the processing step j 105 permits simultaneous, and yet selective, etching of both the metal lines and the poly.

Figure 26:
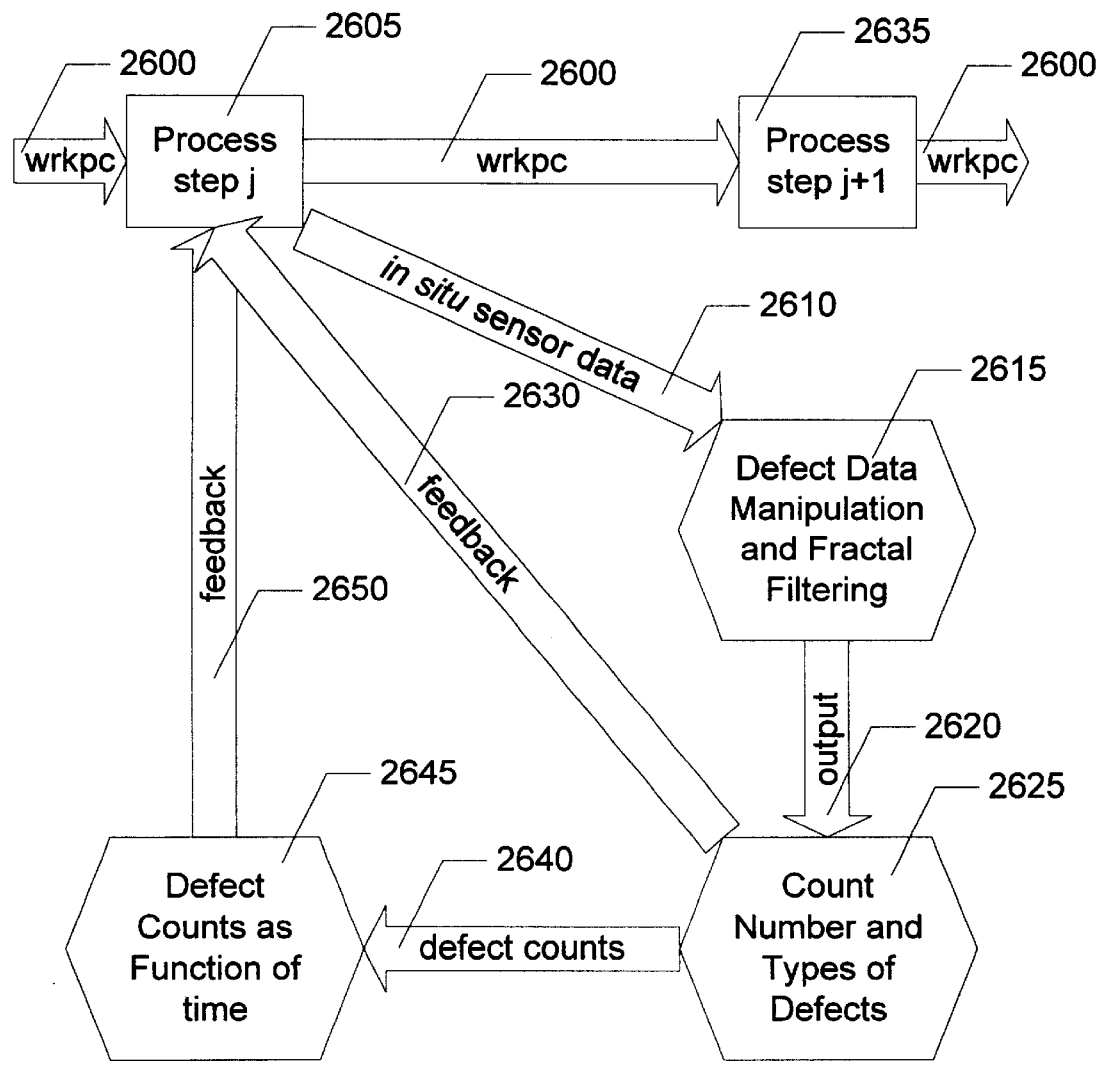
FIGS. 26–28 illustrate schematically various alternative embodiments of a method for manufacturing according to the present invention.

As shown in FIG. 26, a workpiece 2600, such as a semiconducting substrate or wafer, for example, is delivered to a processing step j 2605, where j may have any value from j=1 to j=N. The total number N of processing steps, such as masking, etching, depositing material and the like, used to form the finished workpiece 2600, may range from N=1 to about any finite value.

As shown in FIG. 26, the workpiece 2600 is sensed and/or scanned by an in situ sensor or monitor (not shown) in the processing step j 2605 to detect data indicative of defective processing, and/or defective processing conditions, after the processing has begun in the processing step j 2605. For example, in the processing step j 2605, the workpiece 2600 may be sensed and/or scanned by in situ sensors or monitors capable of detecting metal bridges formed between features formed on the workpiece 2600, producing in situ sensor data 2610 indicative of defective processing, and/or defective processing conditions. Additionally, and/or alternatively, in the processing step j 2605, the workpiece 2600 may be sensed and/or scanned by in situ sensors capable of detecting large particles in the processing chamber, microscratches, ragged polysilicon (poly) lines, blue dots, extra patterns, and the like, formed on the workpiece 2600, again producing in situ sensor data 2610 indicative of defective processing, and/or defective processing conditions. Additionally, and/or alternatively, the output/exhaust (not shown) of the tool doing the processing (not shown) in the processing step j 2605 may be sensed and/or scanned by in situ sensors capable of detecting and measuring gas particles in the processing chamber over time, and the like, again producing in situ sensor data 2610 indicative of changes in the actual processing, and/or defective processing, and/or defective processing conditions.

As shown in FIG. 26, the in situ sensor data 2610 is sent from the processing step j 2605 to a defect data manipulation and fractal filtering step 2615. In the defect data manipulation and fractal filtering step 2615, the in situ sensor data 2610 may be manipulated, for example, by being classified according to the type of defect detected, producing the output signal 2620.

In illustrative embodiments, the in situ sensor data 2610 may be manipulated to provide comparative and/or difference scan data, comparing one die to another on the same workpiece 2600, for example. Noise due to nuisance problems such as metal grains and/or particles and/or particulates may be reduced by using a fractal-type filtering algorithm (fractal filtering) to filter the in situ sensor data 2610 in the defect data manipulation and fractal filtering step 2615, as described above, and as shown in FIGS. 2–21.

Figure 27:
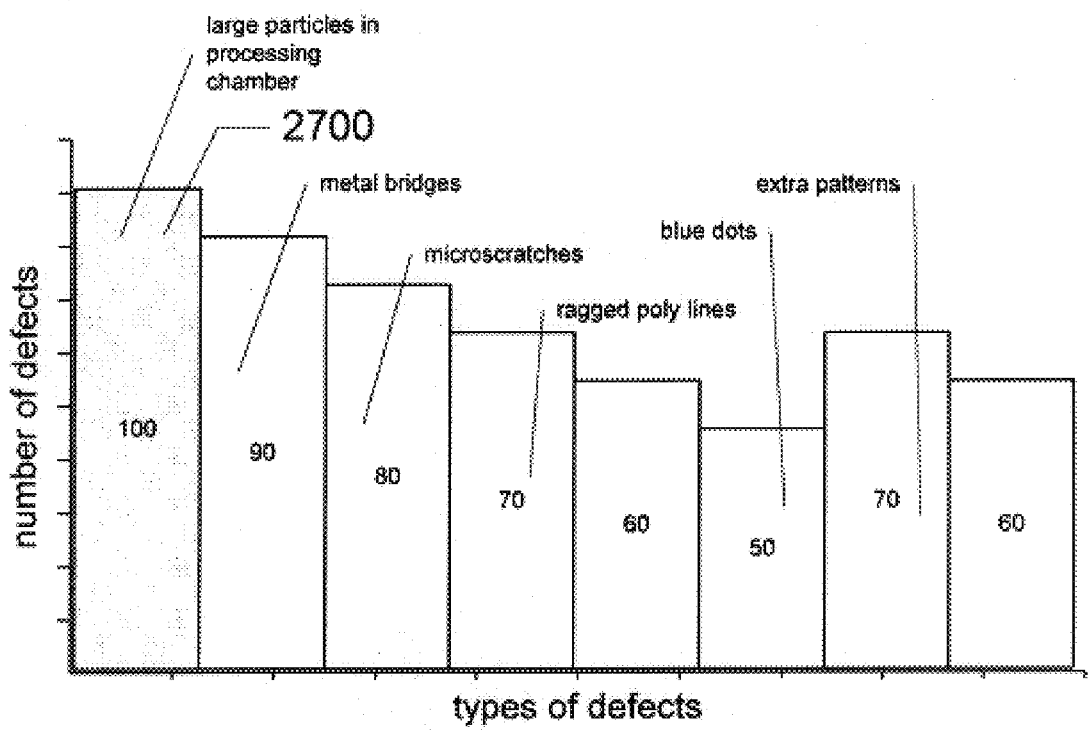

As shown in FIG. 26, the output signal 2620 is sent from the defect date manipulation and fractal filtering step 2615 to a first defect data display step 2625. In the first defect data display step 2625, the output signal 2620 may be displayed, for example, by being presented in the form of a histogram, as illustrated in FIGS. 22, 24 and 27, showing both the count number (defect counts 2640) and the types of defects represented by the output signal 2620. As shown in FIG. 22, in one illustrative embodiment, the number of metal bridges (shown shaded at 2200) formed between features formed on the workpiece 2600 is about 80, in the location scanned, for the duration of the scan. Similarly, as shown in FIG. 24, in another illustrative embodiment, the number of ragged poly lines (shown shaded at 2400) is about 50, in the location scanned, for the duration of the scan. Likewise, as shown in FIG. 27, in yet another illustrative embodiment, the number of large particles in the processing chamber (shown shaded at 2700) is about 100, in the location scanned, for the duration of the scan.

The display of the output signal 2620 in the first defect data display step 2625 may be used to alert an engineer of the need to adjust the processing performed in the processing step j 2605 to reduce at least one type of defect sensed and/or scanned by in situ sensors in the processing step j 2605. The engineer may also alter, for example, the classification of the in situ sensor data 2610, in the defect date manipulation and fractal filtering step 2615, according to the type of defect detected, affecting the output signal 2620 produced.

As shown in FIG. 26, a feedback control signal 2630 is sent from the first defect data display step 2625 to the processing step j 2605 to adjust the processing performed in the processing step j 2605 to reduce at least one type of defect detected, by being sensed and/or scanned by in situ sensors, for example. in the processing step j 2605. In one illustrative embodiment, as shown in FIG. 27, when the number of large particles (shown shaded at 2700) exceeds a predetermined value, for example, about 100, the feedback control signal 2630 may act to cause the processing performed in the processing step j 2605 to do chamber pasting and/or initiate chamber conditioning, for example.

In another illustrative embodiment, as shown in FIG. 22, when the number of metal bridges (shown shaded at 2200) formed between features formed on the workpiece 2600 exceeds a predetermined value, for example, about 80, the feedback control signal 2630 may act to cause the processing performed in the processing step j 2605 to increase the overetch time. In yet another illustrative embodiment, as shown in FIG. 24, when the number of ragged poly lines (shown shaded at 2400) formed on the workpiece 2600 exceeds a predetermined value, for example, about 50, the feedback control signal 2630 may act to cause the processing performed in the processing step j 2605 to decrease the poly etch time.

As shown in FIG. 26, the workpiece 2600 is sent from the processing step j 2605 to a processing step j+1 2635. In the processing step j+1 2635, the workpiece 2600 undergoes another one of the total number N of processing steps, such as masking, etching, depositing material and the like, used to form the finished workpiece 2600. As shown in FIG. 26, the workpiece 2600 is then sent from the processing step j+1 2635. After the processing has begun in the processing step j+1 2635, the workpiece 2600 may be sensed and/or scanned by in situ sensors (not shown) in the processing step j+1 2635 to detect data indicative of defective processing, and/or defective processing conditions, as described above.

Figure 28:
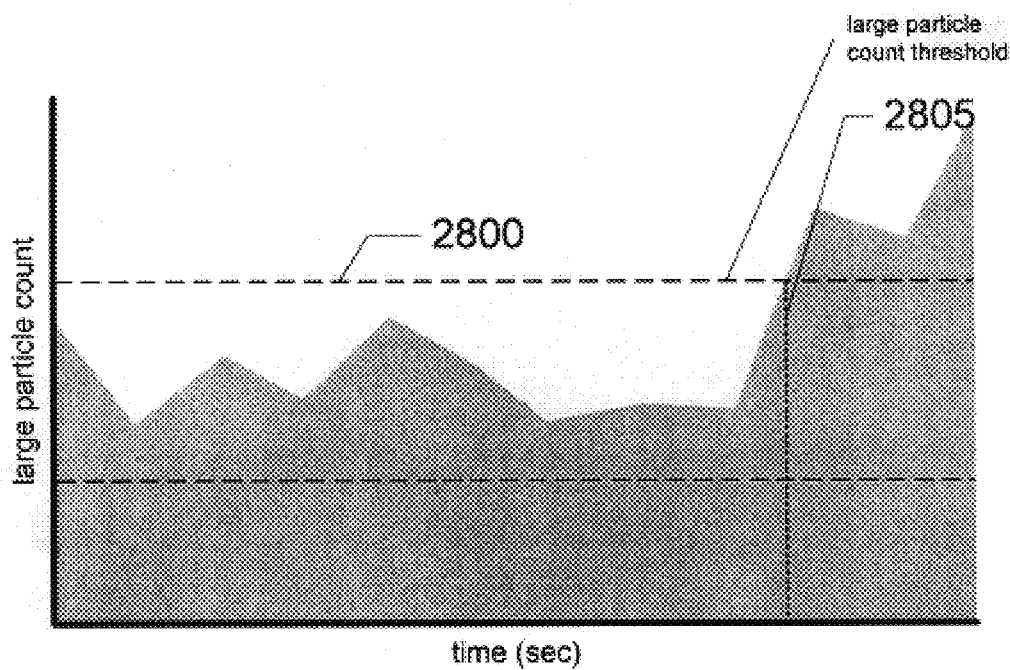

As shown in FIG. 26, in addition to, and/or instead of, the feedback control signal 2630, the defect counts 2640 may be sent from the first defect data display step 2625 to a second defect data display step 2645. In the second defect data display step 2645, the defect counts 2640 may be displayed, for example, by being presented in the form of a graph, as illustrated in FIG. 28, showing the number of defects sensed and/or scanned by in situ sensors in the processing step j 2605 plotted as a function of time (measured in seconds). As shown in FIG. 28, in one illustrative embodiment. the number of large particles in the processing chamber eventually crosses the large particle count threshold 2800 (shown in dashed phantom) at the time 2805 (shown in dotted phantom).

The display of the defect counts 2640 in the second defect data display step 2645 may be used to alert an engineer of the need to adjust the processing performed in the processing step j 2605 to reduce at least one type of defect sensed and/or scanned by in situ sensors in the processing step j 2605. The engineer may also adjust, for example, the large particle count threshold 2800 (shown in dashed phantom in FIG. 28). The engineer may also select, for example, the type of defect whose defect counts 2640 are to be displayed in the second defect data display step 2645.

As shown in FIG. 26, a feedback control signal 2650 may be sent from the second defect data display step 2645 to the processing step j 2605 to adjust the processing performed in the processing step j 2605 to reduce at least one type of defect detected, by being sensed and/or scanned by in situ sensors, for example, in the processing step j 2605. In one illustrative embodiment, as shown in FIG. 28, the number of large particles in the processing chamber eventually crosses the large particle count threshold 2800 (shown in dashed phantom) and the feedback control signal 2650 may act to cause the processing performed in the processing step j 2605 to do chamber pasting and/or initiate chamber conditioning, for example.

In another illustrative embodiment, as shown in FIG. 23, when the number of metal bridges/cm$^2$ formed between features crosses the defect surface density threshold 2300 (shown in dashed phantom) at the time 2305 (shown in dotted phantom), the feedback control signal 2650 may act to cause the processing performed in the processing step j 2605 to increase the overetch time.

As shown in FIG. 25, in yet another illustrative embodiment, the number of ragged poly lines/cm$^2$ formed on the workpiece 2600 may eventually cross the defect surface density threshold 2500 (shown in dashed phantom) at the time 2505 (shown in dotted phantom). In this illustrative embodiment, the feedback control signal 2650 may act to cause the processing performed in the processing step j 2605 to decrease the poly etch time.

In one illustrative embodiment, in both the first and second defect data display steps 2625 and 2645, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Any of the above-disclosed embodiments of a method of manufacturing according to the present invention enables the use of the output signal from an inspection tool to make real-time processing tool adjustments, either manually and/or automatically, in order to improve and/or better control the yield. This defect detection may be downstream from the processing step (see, for example, FIG. 1), or, alternatively and/or additionally, may be performed in situ (see, for example, FIG. 26). Additionally, any of the above-disclosed embodiments of a method of manufacturing according to the present invention enables semiconductor device fabrication with increased device density and precision and enable a streamlined and simplified process flow, thereby decreasing the complexity and lowering the costs of the manufacturing process and increasing throughput.

Any of the above-disclosed embodiments of a method of manufacturing according to the present invention enables the use of fractal filtering, as described above and in FIGS. 2–21, for example, to be applied to scan data indicative of defective processing, thus enabling a classification of the scan data into data clusters. From the fractally filtered scan data thus sorted by clusters, a pattern and/or patterns may emerge. The fractally filtered scan data may then be presented in a user-friendly graphical representation that may be analyzed by an engineer to determine the patterns. The fractally filtered scan data may additionally and/or alternatively be stored and used for comparison purposes in an artificial intelligence (AI)-based system and/or a knowledge-based system. Once the root causes of the processing failure and/or the type of defect detected are known, then these root causes may be tied to the fractal analysis and may be used for future reference purposes.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing, the method comprising:
   processing a workpiece in a processing step;
   detecting defect data after the processing of the workpiece in the processing step has begun;
   filtering the defect data using a fractal filter;

forming an output signal corresponding to at least one type of defect based on the fractally filtered defect data; and feeding back a control signal based on the output signal to adjust the processing performed in the processing step to reduce the at least one type of defect.

2. The method of claim 1, wherein the filtering uses a Hoshen-Kopelman method.

3. The method of claim 1, wherein the filtering uses a Ziff method.

4. The method of claim 1, wherein the formation of the output signal includes counting the number of the at least one type of defect and the feeding back of the control signal based on the output signal includes feeding back the control signal when the number of the at least one type of defect is at least about a predetermined value.

5. The method of claim 1, wherein the formation of the output signal includes determining a surface density of the at least one type of defect as a function of time and the feeding back of the control signal based on the output signal includes feeding back the control signal when the surface density of the at least one type of defect is at least about a predetermined value.

6. The method of claim 1, wherein the formation of the output signal includes counting the number of the at least one type of defect and determining a surface density of the at least one type of defect as a function of time.

7. The method of claim 6, wherein the feeding back of the control signal based on the output signal includes feeding back the control signal when the number of the at least one type of defect is at least about a first predetermined value.

8. The method of claim 6, wherein the feeding back of the control signal based on the output signal includes feeding back the control signal when the surface density of the at least one type of defect is at least about a second predetermined value.

9. The method of claim 7, wherein the feeding back of the control signal based on the output signal further includes feeding back the control signal when the surface density of the at least one type of defect is at least about a second predetermined value.

10. The method of claim 9, wherein the formation of the output signal includes counting the number of a second type of defect different than the at least one type of defect and determining a surface density of the second type of defect as a function of time and the feeding back of the control signal based on the output signal includes feeding back the control signal when the number of the second type of defect is at least about a third predetermined value and when the surface density of the second type of defect is at least about a fourth predetermined value.

11. A method of manufacturing, the method comprising:

processing a first workpiece in a processing step;

detecting defect data in an inspection step after the processing of the first workpiece in the processing step;

filtering the defect data using a fractal filter using one of a Hoshen-Kopelman method and a Ziff method;

forming an output signal corresponding to at least one type of defect based on the fractally filtered defect data; and feeding back a control signal based on the output signal to adjust the processing performed in the processing step on a second workpiece to reduce the at least one type of defect.

12. The method of claim 11, wherein the formation of the output signal includes counting the number of the at least one type of defect and determining a surface density of the at least one type of defect as a function of time.

13. The method of claim 12, wherein the feeding back of the control signal based on the output signal includes feeding back the control signal when the number of the at least one type of defect is at least about a first predetermined value.

14. The method of claim 13, wherein the feeding back of the control signal based on the output signal further includes feeding back the control signal when the surface density of the at least one type of defect is at least about a second predetermined value.

15. The method of claim 14, wherein the formation of the output signal includes counting the number of a second type of defect different than the at least one type of defect and determining a surface density of the second type of defect as a function of time and the feeding back of the control signal based on the output signal includes feeding back the control signal when the number of the second type of defect is at least about a third predetermined value and when the surface density of the second type of defect is at least about a fourth predetermined value.

16. A method of manufacturing, the method comprising:

processing a workpiece in a processing step;

detecting defect data using an in situ sensor after the processing of the workpiece in the processing step has begun;

filtering the defect data using a fractal filter using one of a Hoshen-Kopelman method and a Ziff method;

forming an output signal corresponding to at least one type of defect based on the fractally filtered defect data; and feeding back a control signal based on the output signal to adjust the processing performed on the workpiece in the processing step to reduce the at least one type of defect.

17. The method of claim 16, wherein the formation of the output signal includes counting the number of the at least one type of defect and determining a surface density of the at least one type of defect as a function of time.

18. The method of claim 17, wherein the feeding back of the control signal based on the output signal includes feeding back the control signal when the number of the at least one type of defect is at least about a first predetermined value.

19. The method of claim 18, wherein the feeding back of the control signal based on the output signal further includes feeding back the control signal when the surface density of the at least one type of defect is at least about a second predetermined value.

20. The method of claim 19, wherein the formation of the output signal includes counting the number of a second type of defect different than the at least one type of defect and determining a surface density of the second type of defect as a function of time and the feeding back of the control signal based on the output signal includes feeding back the control signal when the number of the second type of defect is at least about a third predetermined value and when the surface density of the second type of defect is at least about a fourth predetermined value.

* * * * *